United States Patent
Numabe et al.

(10) Patent No.: US 10,115,652 B2
(45) Date of Patent: Oct. 30, 2018

(54) SEMICONDUCTOR DEVICE AND SEMICONDUCTOR APPARATUS

(71) Applicant: Renesas Electronics Corporation, Koutou-ku, Tokyo (JP)

(72) Inventors: Hideo Numabe, Tokyo (JP); Koji Tateno, Tokyo (JP); Yusuke Ojima, Tokyo (JP); Yoshihiko Yokoi, Tokyo (JP); Shinya Ishida, Tokyo (JP); Hitoshi Matsuura, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/430,455

(22) Filed: Feb. 11, 2017

(65) Prior Publication Data

US 2017/0287802 A1 Oct. 5, 2017

(30) Foreign Application Priority Data

Mar. 31, 2016 (JP) .................. 2016-070540

(51) Int. Cl.
*H01L 27/06* (2006.01)
*H01L 23/34* (2006.01)
(Continued)

(52) U.S. Cl.
CPC ........ *H01L 23/34* (2013.01); *H01L 21/26513* (2013.01); *H01L 21/2855* (2013.01); *H01L 21/30604* (2013.01); *H01L 21/31111* (2013.01); *H01L 21/32055* (2013.01); *H01L 21/823412* (2013.01); *H01L 23/5228* (2013.01); *H01L 23/5286* (2013.01); *H01L 23/53271* (2013.01); *H01L 28/20* (2013.01); *H01L 29/0692* (2013.01); *H03K 17/16* (2013.01); *H01L 29/7393* (2013.01); *H01L 29/74* (2013.01); *H01L 29/78* (2013.01); *H01L 29/861* (2013.01); *H03K 2017/0806* (2013.01);
(Continued)

(58) Field of Classification Search
CPC . H01L 23/34; H01L 23/5228; H01L 23/5286; H01L 23/53271; H01L 21/26513; H01L 21/2855; H01L 21/30604; H01L 21/31111; H01L 21/32055; H01L 21/823412; H01L 28/20; H01L 29/0692; H01L 29/7393; H01L 29/74; H01L 29/78; H01L 29/861; H03K 17/16; H03K 2017/0806; H03K 2217/0027; H03K 2217/0063; H03K 2217/0072
See application file for complete search history.

(56) References Cited

U.S. PATENT DOCUMENTS

2008/0283955 A1* 11/2008 Reynes ............... H01L 27/0211
257/470
2009/0046489 A1* 2/2009 Yoshimura .......... H01F 17/0013
363/123
(Continued)

FOREIGN PATENT DOCUMENTS

JP 2011-133420 A 7/2011

*Primary Examiner* — Sitaramarao S Yechuri
(74) *Attorney, Agent, or Firm* — Shapiro, Gabor and Rosenberger, PLLC

(57) ABSTRACT

A semiconductor device includes a power device and a temperature detection diode. The semiconductor device has a device structure configured to insulate between a power lien of the power device and the temperature detection diode.

6 Claims, 27 Drawing Sheets

(51) Int. Cl.
  *H01L 21/265*   (2006.01)
  *H01L 21/285*   (2006.01)
  *H01L 21/306*   (2006.01)
  *H01L 21/311*   (2006.01)
  *H01L 21/3205*  (2006.01)
  *H01L 21/8234*  (2006.01)
  *H01L 23/522*   (2006.01)
  *H01L 23/528*   (2006.01)
  *H01L 23/532*   (2006.01)
  *H01L 49/02*    (2006.01)
  *H01L 29/06*    (2006.01)
  *H03K 17/16*    (2006.01)
  *H01L 29/739*   (2006.01)
  *H01L 29/74*    (2006.01)
  *H01L 29/78*    (2006.01)
  *H01L 29/861*   (2006.01)
  *H03K 17/08*    (2006.01)

(52) U.S. Cl.
  CPC ............. *H03K 2217/0027* (2013.01); *H03K 2217/0063* (2013.01); *H03K 2217/0072* (2013.01)

(56) References Cited

U.S. PATENT DOCUMENTS

| | | | |
|---|---|---|---|
| 2010/0219785 A1* | 9/2010 | Hirose | H01L 27/0658 318/519 |
| 2013/0043490 A1* | 2/2013 | Sorada | H01L 21/044 257/77 |
| 2014/0319540 A1* | 10/2014 | Sugimoto | H01L 29/7804 257/77 |
| 2016/0111348 A1* | 4/2016 | Yao | H01L 29/66348 257/49 |
| 2016/0233214 A1* | 8/2016 | Shimono | H01L 27/0664 |

* cited by examiner

FIG. 13
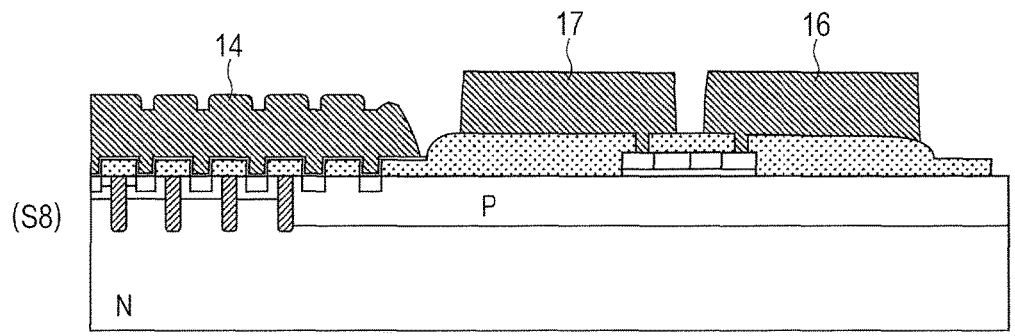
(S8)
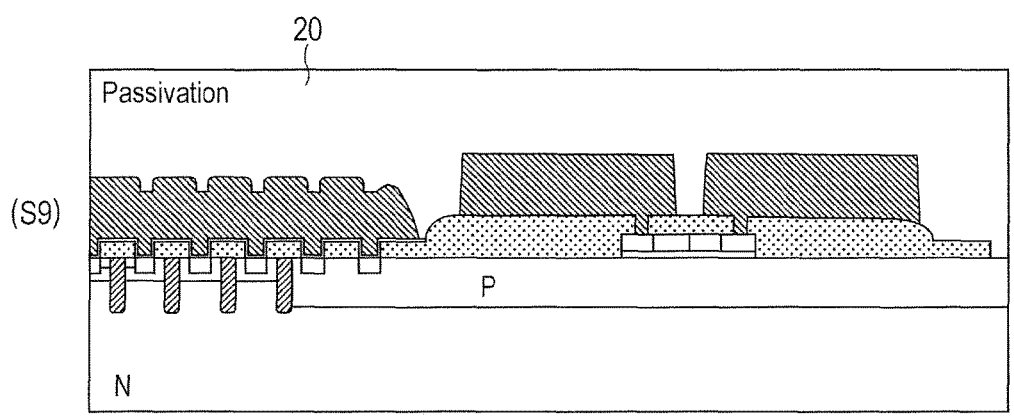
(S9)
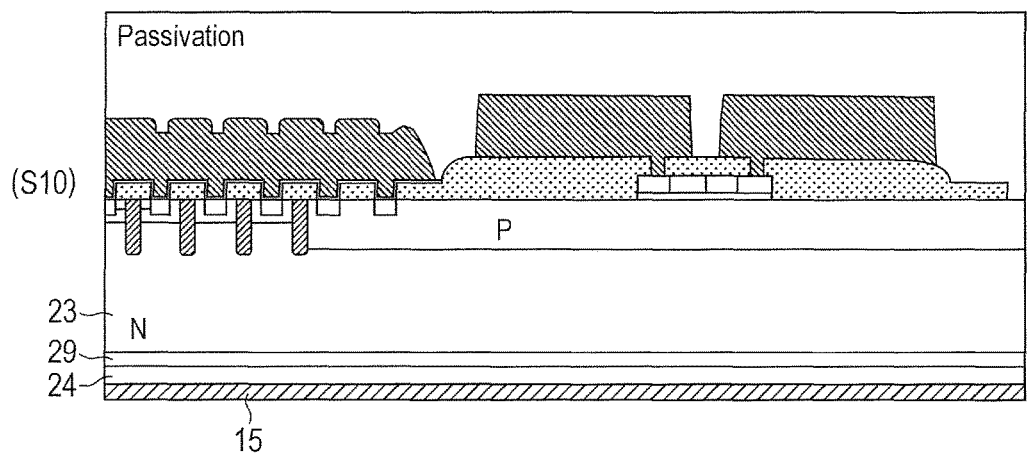
(S10)

FIG. 23
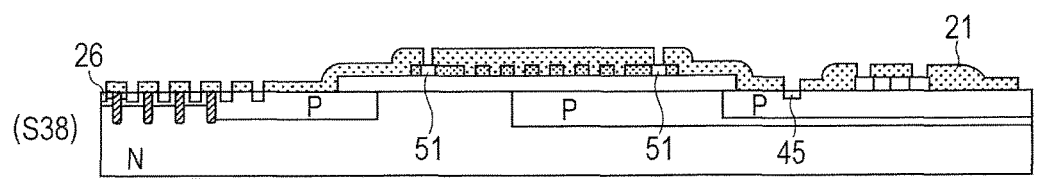
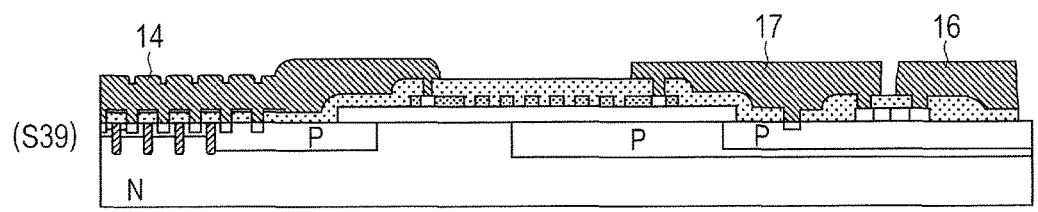
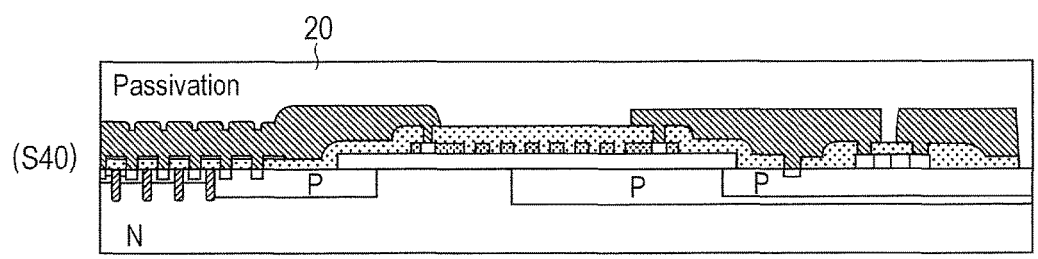
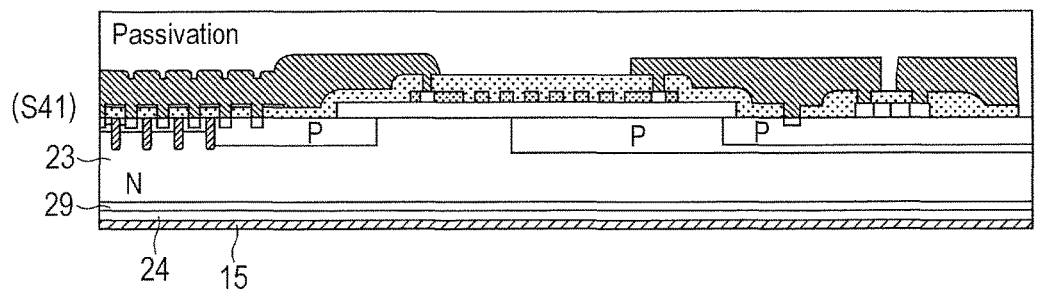

SEMICONDUCTOR DEVICE AND SEMICONDUCTOR APPARATUS

CROSS-REFERENCE TO RELATED APPLICATIONS

The disclosure of Japanese Patent Application No. 2016-070540 filed on Mar. 31, 2016 including the specification, drawings and abstract is incorporated herein by reference in its entirety.

The present invention relates to a semiconductor device and a semiconductor apparatus, and relates to a semiconductor for use in a high-side circuit, for example, in an inverter, and a semiconductor apparatus using the same.

BACKGROUND

Japanese Patent Application No. 2015-249302 by another application of the present applicant discloses a circuit configuration of FIG. 27. A semiconductor apparatus illustrated in FIG. 27 includes an inverter IVU and various control circuits for the inverter IVU. This inverter IVU includes high-side switches HSWu, HSWv, and HSWw of three phases (u-phase, v-phase, and w-phase) and low-side switches LSWu, LSWv, LSWw of three phases. To the inverter IVU, an input source voltage VIN is supplied using a reference source voltage GND as a reference. The inverter IVU supplies electricity to a load LD of the motor, by generating current AC voltages (floating voltages) VSu, VSv, and VSw of three phases to load drive terminals PN_OUTu, PN_OUTv, and PN_OUTw, by, for example, PWM (Pulse Width Modulation) control.

The various control circuits include high-side control circuits HCTu, HCTv, and HCTw controlling and protecting the high-side switches HSWu, HSWv, and HSWw of three phases and low-side control circuits LCTu, LCTv, LCTw controlling and protecting the low-side switches LSWu, LSWv, and LSWw of three phases. Further, the various control circuits include an MCU (Micro Control Unit), high-side temperature detection circuits TChu, TChv, and TChw of three phases, and low-side temperature detection circuits TClu, TClv, and TClw of three phases.

The temperature detection circuit TChu includes two diodes DD1a and DD1b, two current sources IS1a and IS1b, and a differential amplifier circuit AMP1. The cathode of the diode DD1a is coupled to the anode of a temperature detection diode TDhu, while the cathode of the diode DD1b is coupled to the cathode of a temperature detection diode TDhu. The cathode of the temperature detection diode TDhu is coupled also to the load drive terminal PN_OUTu (floating voltage VSu).

The current source IS1a is coupled between a source voltage VDD and the anode of the diode DD1a, and controls a current to flow in a forward direction through the temperature detection diode TDhu via the diode DD1a. The current source IS1b is coupled between the source voltage VDD and the anode of the diode DD1b, and controls a current to flow through the diode DD1b in a forward direction. The differential amplifier circuit AMP1 detects a differential voltage between the anode of the diode DD1a and the anode of the diode DD1b, and transmits a result of this detection to an analog/digital converter ADC1 of a controller CTLU. Though not illustrated, details of the temperature detection circuits TChv and TChw are the same as those of the temperature detection circuit TChu.

The temperature detection circuit TClu includes a current source IS2 and a differential amplifier circuit AMP2. The current source IS2 is coupled between the source voltage VDD and the anode of the temperature detection diode TDlu, and controls a current to flow in a forward direction through the temperature detection diode TDlu. The cathode of the temperature detection diode TDlu is coupled to a reference source terminal PN_GND (a reference source voltage GND). The differential amplifier circuit AMP2 detects a differential voltage between the anode and the cathode of the temperature detection diode TDlu, and transmits a result of this detection to an analog/digital converter ADC2 of the controller CTLU. Though not illustrated, details of the temperature detection circuits TClv and TClw are the same as those of the temperature detection circuit TClu.

FIG. 28 illustrates an example of an operation of the semiconductor apparatus illustrated in FIG. 27. The horizontal axis indicates the time elapsed, while the vertical axis indicates the voltage level or the high/low level. FIG. 28 illustrates an operation of u-phase, and the same applies to the v-phase and the w-phase.

In a time T1, a low-side switch signal LOu to be a gate input of a low-side transistor TRlu is at the "H" level, while a high-side switch signal HOu to be a gate input of a high-side transistor TRhu is at the "L" level. In the time T1, a current from the current source IS1a flows through the temperature detection diode TDhu via the forward bias diode DD1a, while a current from the current source IS1b flows through the forward bias diode DD1b.

At this time, at the temperature detection diode TDhu, a forward direction voltage depending on the temperature (specifically, having the negative temperature characteristic) is generated. At the anode of the temperature detection diode TDhu, a temperature voltage signal TOHu corresponding to the forward direction voltage is generated, using the floating voltage VSu as a reference. The values of the currents from the current sources IS1a and IS1b are the same, and, though not limited, are smaller than 1 mA, for example. In the low-side time, the differential amplifier circuit AMP1 detects a forward direction voltage of the temperature detection diode TDhu through the diodes DD1a and DD1b. The same applies to the case in times T3, T5, and T7.

In a time T2, the low-side switch signal LOu is at the "L" level, while the high-side switch signal HOu is at the "H" level. In the time T2, the diodes DD1a and DD1b become reverse bias. Thus, an output signal TIHu of the differential amplifier circuit AMP1 is at the "L" level. That is, the temperature detection diode TDhu does not perform temperature detection. The same applies to the case in times T4 and T6.

Japanese Unexamined Patent Application Publication No. 2011-133420 discloses a configuration in which the cathode of the high-side temperature detection diode is coupled to the ground.

SUMMARY

As described above, in the circuit configuration of FIG. 27, the signal detection and the transfer are performed at the timing of only when the low-side transistor is turned ON. Thus, a problem is that the temperature detection is not possibly performed when the high-side transistor is turned ON. The diode DD1a and the diode DD1b are high withstand voltage diodes, and are expensive. Thus, it is not possible to realize cost saving in the circuit configuration of FIG. 27.

Japanese Unexamined Patent Application Publication No. 2011-133420 does not disclose the detailed circuit configuration, the device structure, and the example of the operation. In the circuit configuration of Japanese Unexamined Patent Application Publication No. 2011-133420, it is not obvious whether the temperature can be detected, both when the high-side transistor is turned ON, and when the low-side transistor is turned ON. In the circuit configuration of Japanese Unexamined Patent Application Publication No. 2011-133420, it is not obvious whether it is necessary to provide high withstand voltage diodes corresponding to the diodes DD1a and DD1b in FIG. 27.

Other objects and new features will be apparent from the descriptions of the present specification and the accompanying drawings.

According to an embodiment, a semiconductor device includes a power devices and a temperature detection diode, and has a device structure for ensuring insulation between a power line of the power device and the temperature detection diode.

According to the embodiment, it is possible to provide a semiconductor device which can perform temperature detection even when the high-side transistor is turned ON, without using a high withstand voltage diode in the fore stage of a differential amplifier circuit for temperature detection.

BRIEF DESCRIPTION OF THE DRAWINGS

FIG. 13 is a diagram illustrating an example of a process flow of the semiconductor device according to the embodiment 1.

FIG. 23 is a diagram illustrating an example of a process flow of the semiconductor device according to the embodiment 3.

DETAILED DESCRIPTION

In the following preferred embodiments, if necessary for convenience sake, descriptions will be made to divided plural sections or preferred embodiments, however, unless otherwise specified, they are not mutually irrelevant, but one is in relations of modifications, application examples, details, supplementary explanations of a part or whole of the other. Further, in the following preferred embodiments, in the case of reference to the number of an element (including quantity, numeric value, amount, range), unless otherwise specified and unless clearly limited in principle, the present invention is not limited to the specified number, and a number over or below the specified one may be used.

In the following preferred embodiments, the constituent elements (including operation steps) are not necessarily indispensable, unless otherwise specified and unless considered that they are obviously required in principle. Similarly, in the following preferred embodiments, in the reference of the forms of the constituent elements or the positional relationships, they intend to include those approximating or similar substantially to the forms and like, unless otherwise specified and unless considered that they are obviously not required in principle. This is also true of the foregoing numerical values (including quantity, numeric value, amount, range).

Overview of Embodiments

Figure 1:
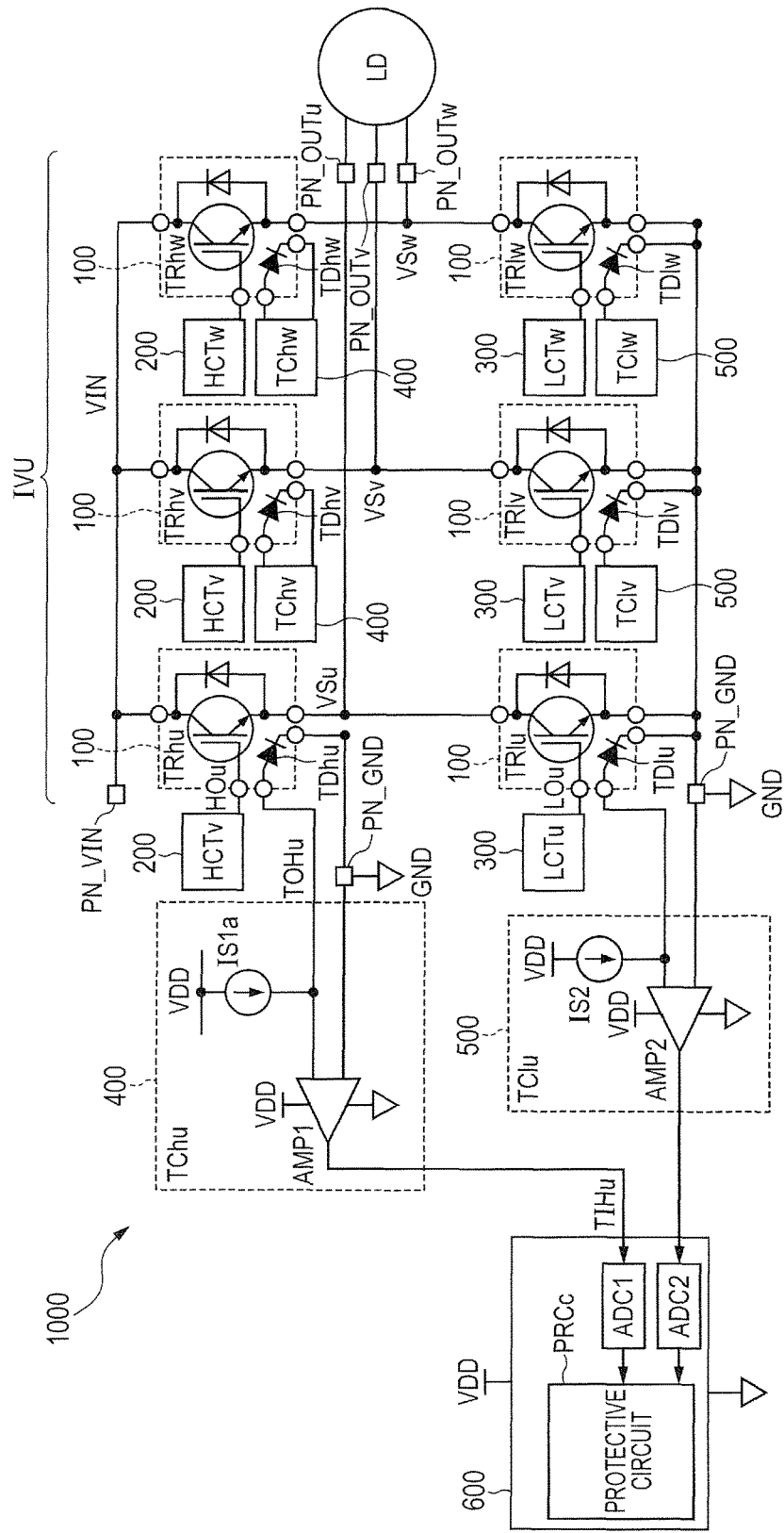
FIG. 1 is a diagram illustrating a circuit configuration of a semiconductor apparatus according to an embodiment.

Prior to the descriptions of preferred embodiments, the overview of the embodiments will now be described. FIG. 1 is a diagram illustrating a circuit configuration of a semiconductor apparatus 1000 according to an embodiment. The semiconductor apparatus 1000 according to the embodiment includes a semiconductor device 100, a high-side control circuit 200, a low-side control circuit 300, a high-side temperature detection circuit 400, a low-side temperature detection circuit 500, and an MCU 600. In the example of FIG. 1, the semiconductor device 100 is used not only for the high-side switch, but also for the low-side switch. However, the semiconductor device 100 may not be used for the low-side switch. As the low-side switch, for example, the low-side switches LSWu, LSWv, and LSWw of FIG. 27 may be used. The high-side control circuit 200, the low-side control circuit 300, the low-side temperature detection circuit 500, and the MCU 600 have the same circuit configurations as those of FIG. 27, and thus will not be described repeatedly over and over.

Figure 2:
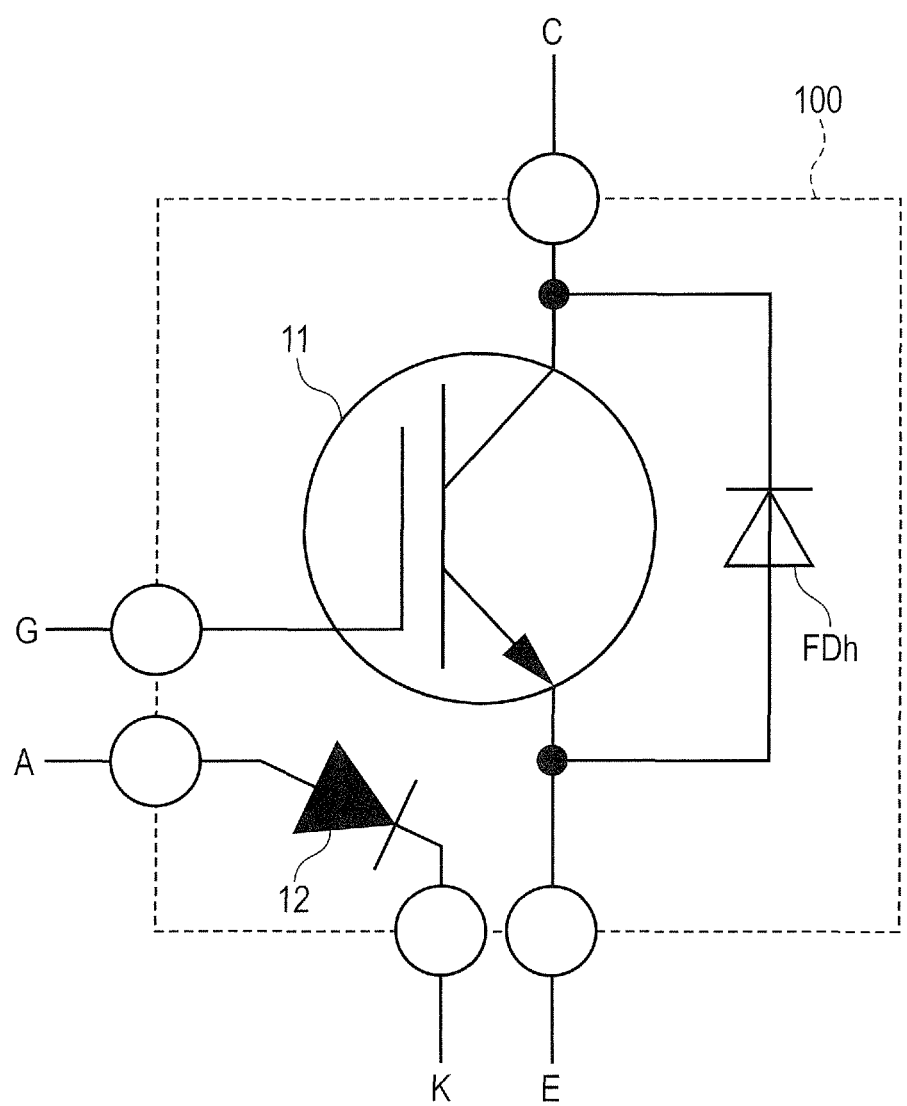
FIG. 2 is a diagram illustrating a circuit configuration of a semiconductor device in FIG. 1.

FIG. 2 is a diagram illustrating a circuit configuration of a semiconductor device in FIG. 1. The semiconductor device 100 includes a power device 11, a temperature detection diode 12, and a circulation diode FDh.

The power device 11 is a device which operates when a high voltage source potential of, for example, several hundred to several thousand volts is supplied. FIG. 2 illustrates an example in which an IGBT (Insulated Gate Bipolar Transistor) is used as the power device 11. In this case, however, the power device 11 is not limited to the IGBT. As the power device 11, a power MOSFET (Metal-Oxide-Semiconductor Field Effect Transistor), the diode, the thyristor may be used. Thus, the semiconductor device 100 may be applied to various applications.

In the semiconductor device 100 according to this embodiment, it is possible to invert the conductive type (p-type or n-type) of the semiconductor substrate, the semiconductor layer, and the diffusion layer (diffusion area). When one of the conductive types of the n-type and p-type is assumed as a first conductive type, and the other conductive type is assumed as a second conductive type, the first conductive type may be the p-type, while the second conductive type may be the n-type. On the contrary, the first conductive type may be the n-type, while the second conductive type may be the p-type.

The temperature detection diode 12 is a diode which detects the temperature in the semiconductor device 100.

The circulation diode FDh is a diode which is parallelly coupled to the power device 11. The circulation diode FDh is, for example, an FRD (Fast Recovery Diode).

Descriptions will continue with reference back to FIG. 1. The high-side temperature detection circuit 400 includes the source current IS1a and the differential amplifier circuit AMP1. The current source IS1a and the differential amplifier circuit AMP1 have the same circuit configurations as those of FIG. 27, and thus will not be described repeatedly over and over.

Figure 27:
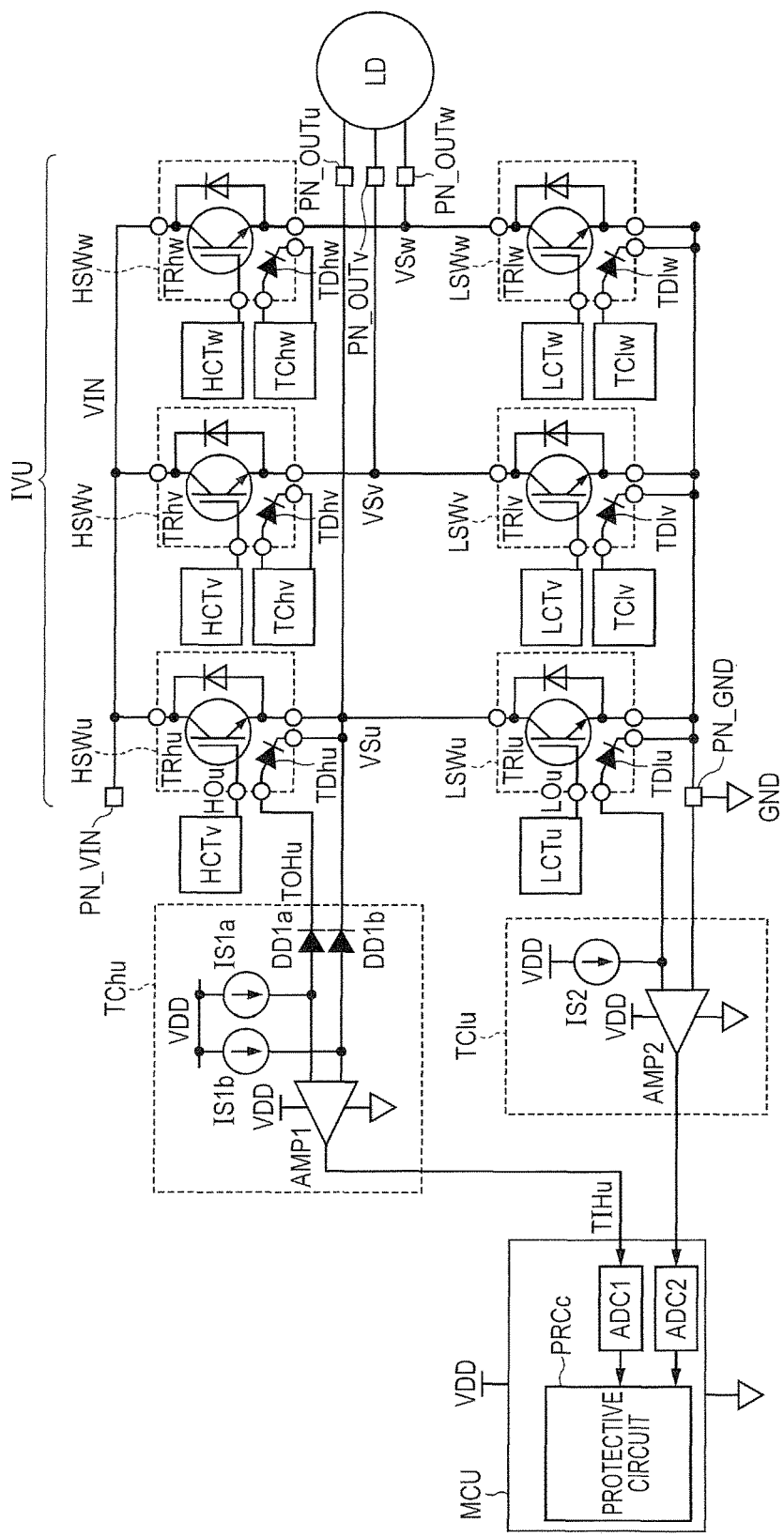
FIG. 27 is a diagram illustrating a circuit configuration of a semiconductor apparatus according to another application of the present applicant.
Figure 28:
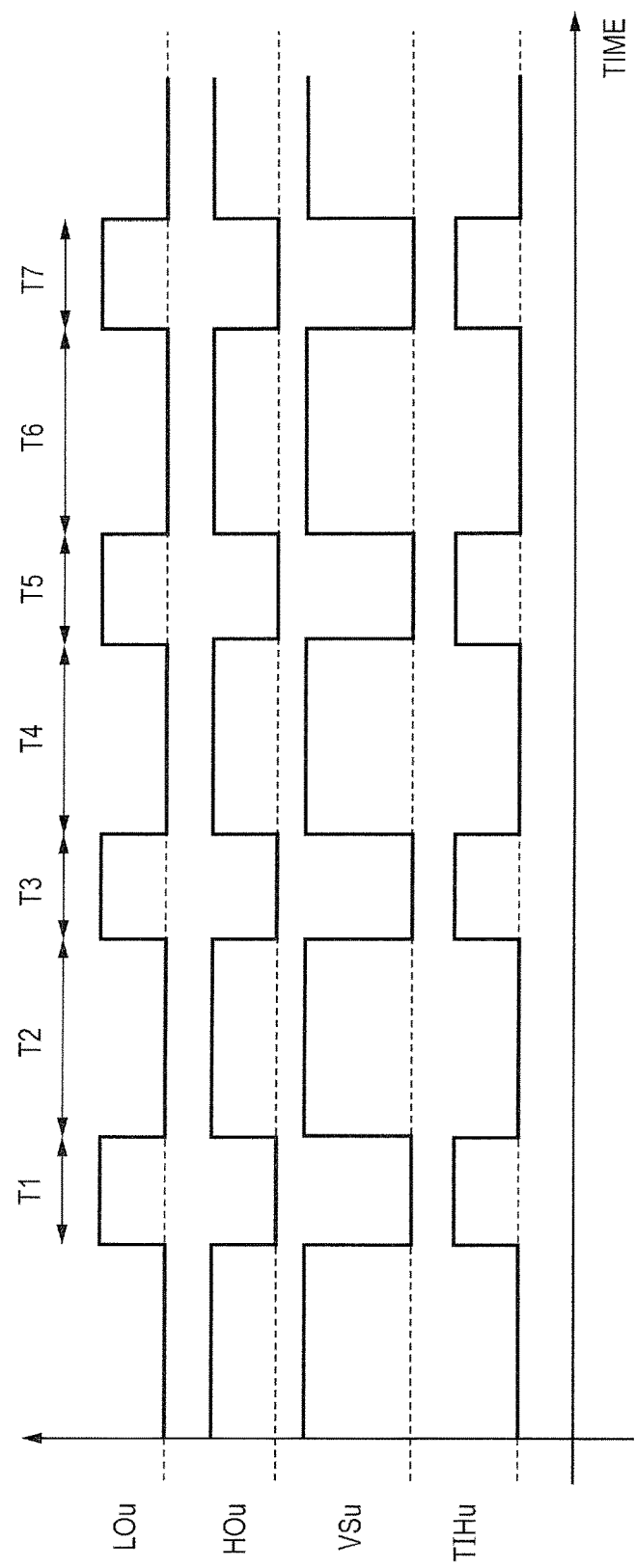
FIG. 28 is a waveform diagram illustrating an example of an operation of the main part of the semiconductor apparatus of FIG. 27.

In FIG. 1, the diode DD1a and the diode DD1b required in the circuit configuration of FIG. 27 are not necessary, and excluded from the high-side temperature detection circuit 400. The reason why the diodes are excluded will hereinafter be described.

In FIG. 1, the cathode of the temperature detection diode TDhu is separated from the emitter of the high-side transistor TRhu, and is coupled to the ground. That is, in the semiconductor device 100, the temperature detection diode 12 is separated from the power line of the power device 11. Thus, in FIG. 1, a high voltage is not applied to the input of the differential amplifier circuit AMP1 by switching of the high-side transistor TRhu, even without the diode DD1a and the diode DD1b in the circuit configuration of FIG. 27.

Therefore, in FIG. 1, the diode DD1a and the diode DD1b required in the circuit configuration of FIG. 27 in the high-side temperature detection circuit 400 are not necessary and excluded from the high-side temperature detection circuit 400. Though not illustrated, in FIG. 1, the high-side temperature detection circuits 400 identified by TChv and TChw are the same as the high-side temperature detection circuit 400 identified by TChu. In FIG. 1, the low-side temperature detection circuits 500 identified by TClv and TClw are the same as the low-side temperature detection circuit 500 identified by TClu.

Figure 3:
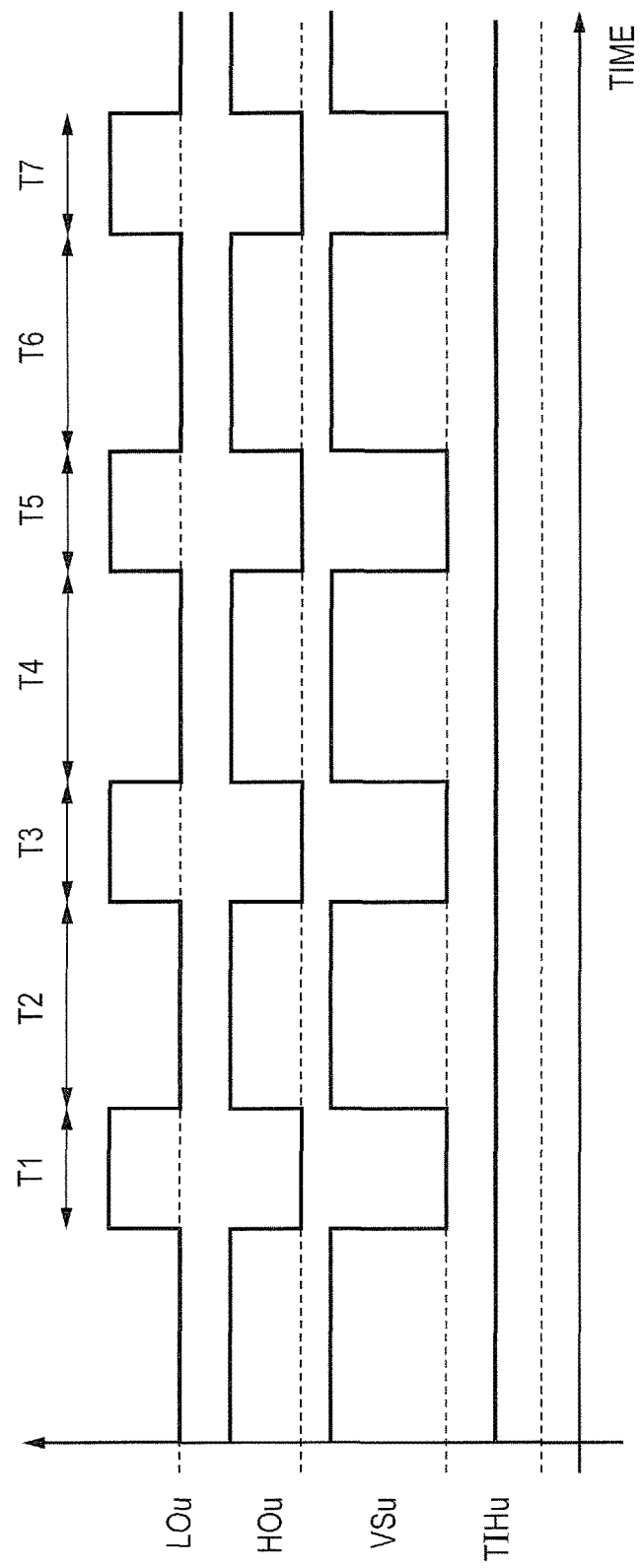
FIG. 3 is a waveform diagram illustrating an example of an operation of the main part of the semiconductor apparatus of FIG. 1.

FIG. 3 illustrates an example of an operation of the semiconductor apparatus 1000 illustrated in FIG. 1. The horizontal axis indicates the time elapsed, while the vertical axis indicates the voltage level or the high/low level. FIG. 3 illustrates an operation of u-phase, and the same applies to the v-phase and the w-phase.

In the time T1, the low-side switch signal LOu as a gate input of the low-side transistor TRlu is at the "H" level, while the high-side switch signal HOu as the gate input of the high-side transistor TRhu is at the "L" level. In the time T1, a current from the current source IS1a flows through the temperature detection diode TDhu.

At this time, in the temperature detection diode TDhu, a forward direction voltage depending on the temperature (specifically, having the negative temperature characteristic) is generated. At the anode of the temperature detection diode TDhu, the temperature voltage signal TOHu corresponding to this forward direction voltage is generated, using the ground potential as a reference. Though not particularly limited, a value of a current from the current source IS1a is smaller than, for example, 1 mA. The differential amplifier circuit AMP1 detects the forward direction voltage of the temperature detection diode TDhu, in the low side time. The same applies to the case in the T3, T5, and T7.

In the time T2, the low-side switch signal LOu is at the "L" level, while the high-side switch signal HOu is at the "H" level. In the time T2, the current from the current source IS1a flows through the temperature detection diode TDhu.

In FIG. 1, the cathode of the temperature detection diode TDhu is separated from the emitter of the high-side transistor TRhu, and coupled to the ground. Thus, also in the time T2, like the time T1, in the anode of the temperature detection diode TDhu, the temperature voltage signal TOHu corresponding to the forward direction voltage is generated, using the ground voltage as a reference. The differential amplifier circuit AMP1 detects the forward direction voltage of the temperature detection diode TDhu, in this high-side time. The same applies to the case in the times T4 and T6.

That is, also in the high-side time, like in the low-side time, it is possible to perform temperature detection by the temperature detection diode TDhu.

Figure 4:
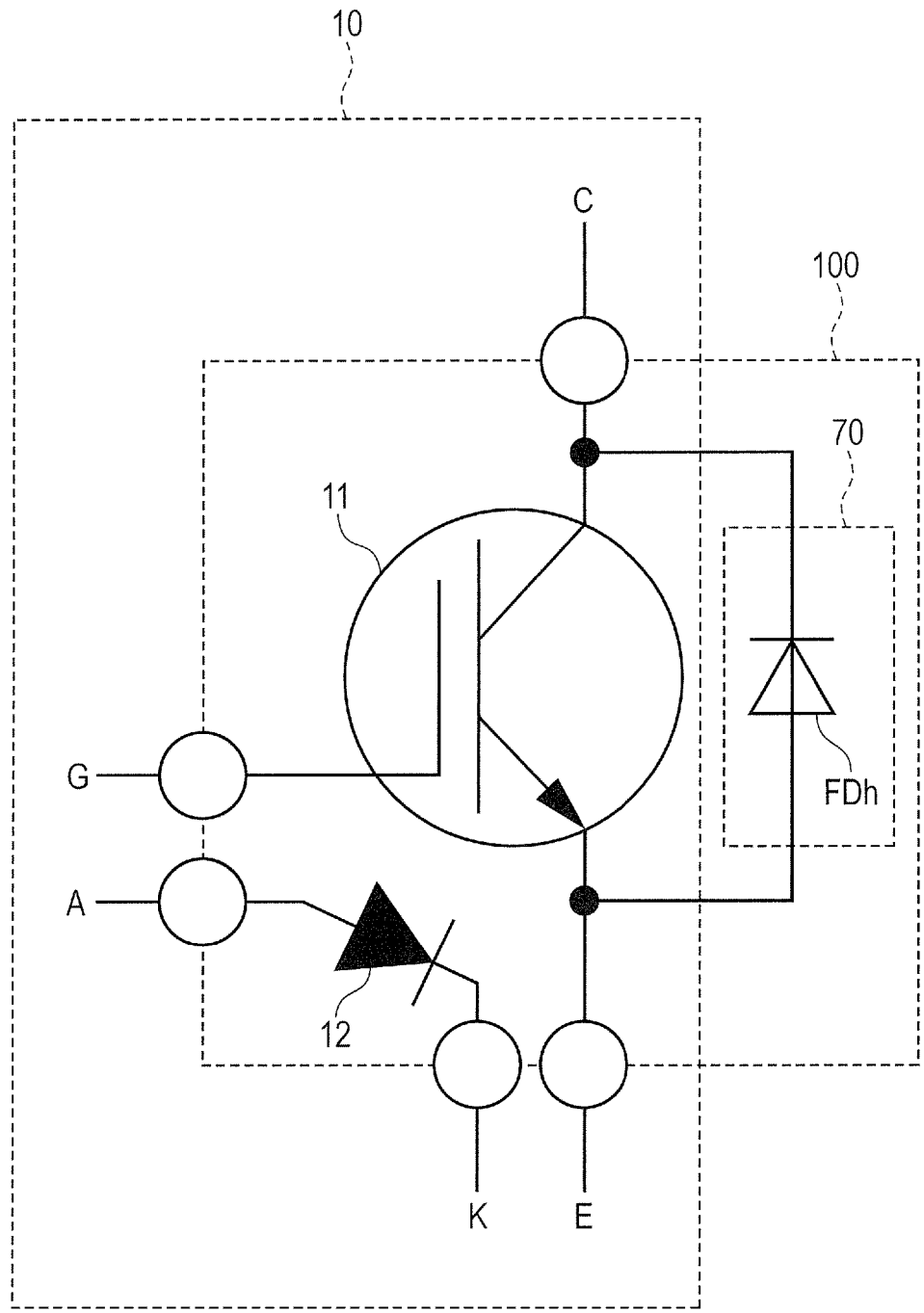
FIG. 4 is a diagram illustrating a semiconductor chip configuration of the semiconductor device of FIG. 2.

Subsequently, descriptions will now be made to an example of a schematic arrangement configuration of the semiconductor device of FIG. 2, using FIG. 4 to FIG. 6.

Descriptions will now be made to a semiconductor chip configuration of the semiconductor device of FIG. 2, using FIG. 4. In FIG. 4, the semiconductor device 100 is configured with a semiconductor chip 10 and a semiconductor chip 70. In the semiconductor chip 10, the power device 11 and the temperature detection diode 12 are included. In the semiconductor chip 70, a circulation diode FDh is formed. In the example of FIG. 4, the semiconductor chip 100 is configured with two chips that are the semiconductor chip 10 and the semiconductor chip 70. However, it may be configured with 2in1 in the form of one chip including the two chips. The circuit symbol of the power device 11 of FIG. 4 represents the IGBT, and descriptions will hereinafter be made to the IGBT by way of example.

Using FIG. 5, descriptions will now be made to an example of a plan view illustrating a schematic arrangement configuration of the semiconductor chip 10 of FIG. 4. In the example of FIG. 5, on the main surface of the semiconductor chip 10, a gate electrode 13 and an emitter electrode 14 of the power device 11 are formed. On the back surface (not illustrated) of the semiconductor chip 10, a collector electrode 15 of the power device 11 is formed. The temperature detection diode 12 is configured by forming, for example, a diffusion layer forming a pn junction, in a region adjacent to the power device 11 of the main surface side of the semiconductor chip 10. On the main surface of the semiconductor chip 10, an anode electrode 16 and a cathode electrode 17 of the temperature detection diode 12 are formed. In FIG. 5, the temperature detection diode 12 is arranged near the end of the semiconductor chip 10. By this arrangement, the active area can widely be formed.

Using FIG. 6, descriptions will now be made to another example of a plan view illustrating a schematic arrangement configuration of the semiconductor chip 10 of FIG. 4. In FIG. 6, the temperature detection diode 12 is arranged near the center, rather than near the end of the semiconductor chip 10. By this arrangement, the temperature detection diode 12 is formed further nearer to the emitter electrode1 14 as a heat generating source. Thus, it is possible to measure precisely the temperature of the power device 11.

Subsequently, using FIG. 7, descriptions will now be made to an example of a cross sectional structure of the semiconductor device 100 according to the embodiment.

Figure 5:
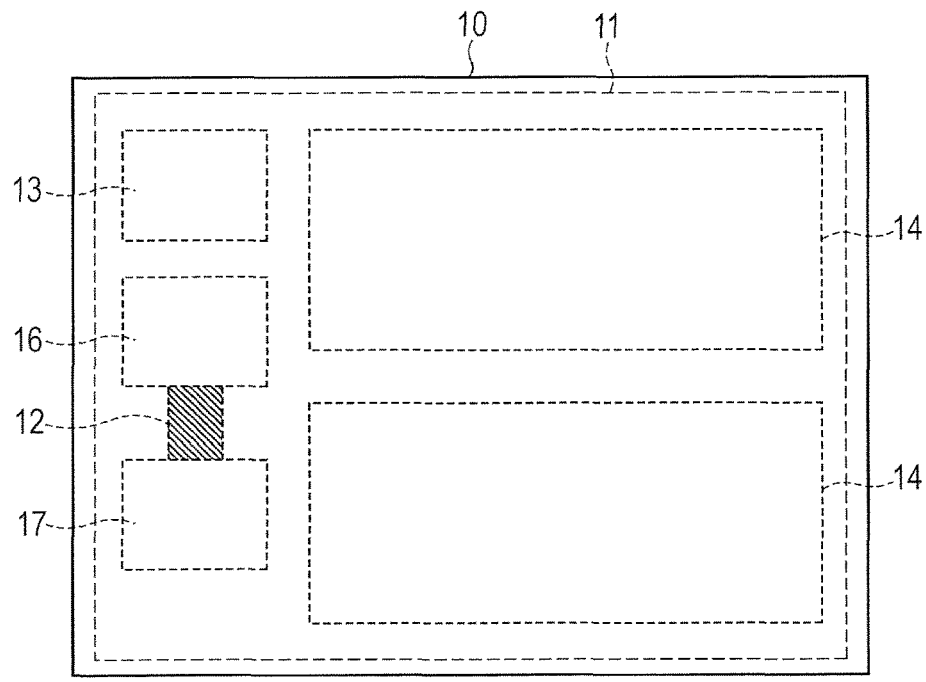
FIG. 5 is a plan view illustrating an example of a schematic arrangement configuration of the semiconductor chip of FIG. 4.
Figure 6:
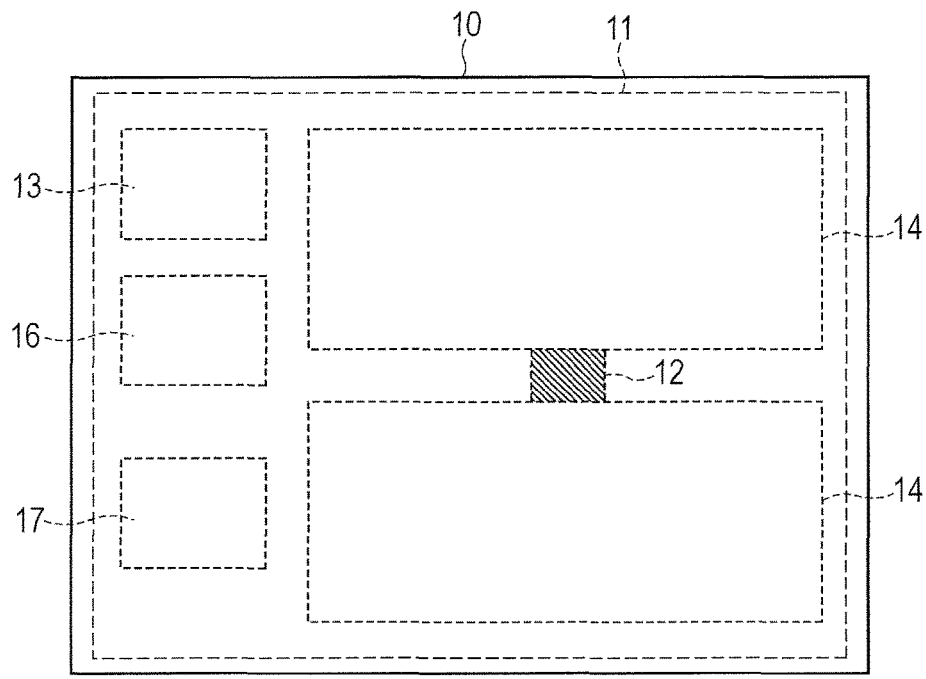
FIG. 6 is a plan view illustrating another example of the schematic arrangement configuration of the semiconductor chip of FIG. 4.
Figure 7:
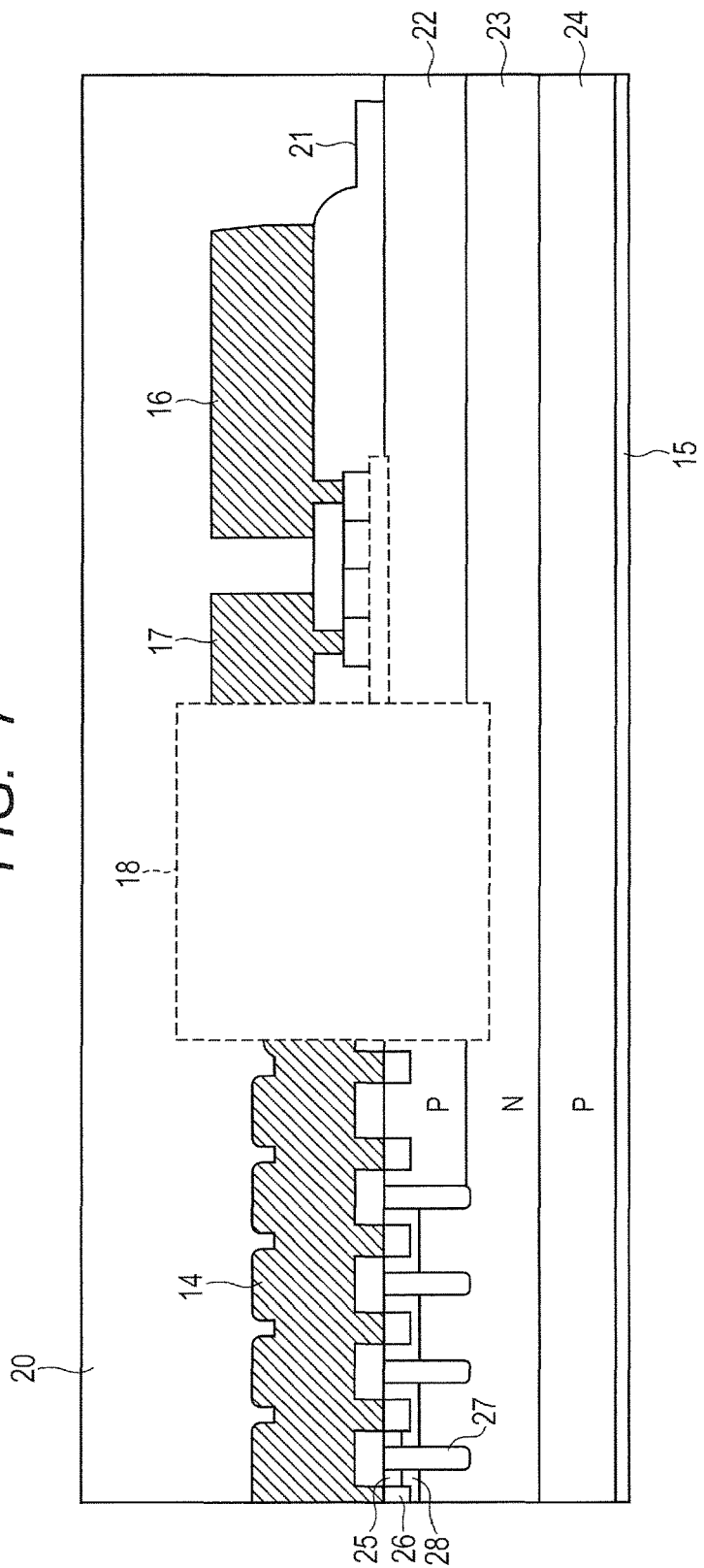
FIG. 7 is a diagram illustrating an example of a cross sectional structure of the semiconductor device according to the embodiment.

FIG. 7 illustrates an example of the semiconductor chip 10 of FIG. 5. On the main surface of the semiconductor chip 10, the gate electrode 13 (not illustrated), the emitter electrode 14, the anode electrode 16, and the cathode electrode 17 are formed. On the back surface of the semiconductor chip 10, the collector electrode 15 is formed.

Formed in the semiconductor chip 10 are a passivation layer 20, a surface insulating film 21, a P layer 22, an N layer 23, a P layer 24, an N-type region 25, a P-type region 26, a trench 27, and a P-type region 28. On the wall surface of the trench 27, a gate insulating film is famed. In the trench 27, a gate region is formed. The gate region in the trench 27 is coupled to the gate electrode 13.

The P layer 22 is an emitter region of the power device 11. The N layer 23 is a drift region. The P layer 24 is a collector region of the power device 11.

The P-type region 26 is a body contact region which is formed in a range facing the surface of the substrate of the semiconductor chip 10. The P-type impurity concentration of the P-type region 26 is higher than the P-type impurity concentration of the P-type region 28.

Descriptions will not be made to the N-type region 25, the P-type region 26, the trench 27, and the P-type region 28, because these are not necessarily mentioned when a device structure 18 is described.

The emitter electrode 14 of the power device 11 in the high-side semiconductor device 100 of FIG. 1 will be at the potential close to the source voltage, by turning it ON from the potential close to the ground. Note that the source voltage is, for example, several hundred to several thousand volts. At this time, the P layer 22 is coupled to the emitter potential of the power device 11, and thus is at the potential close to the source voltage.

The cathode electrode 17 is at the ground potential. Thus, the maximum voltage in the circuit operation is applied between the temperature detection diode 12 and the emitter of the power device 11.

To prevent application of this voltage between the temperature detection diode 12 and the emitter of the power device 11, the semiconductor device 100 has the device structure 18 for ensuring insulation of the power line of the power device 11 and the temperature detection diode 12. Details of the device structure 18 will be described in embodiments 1 to 3.

As described above, the semiconductor device 100 according to the embodiment includes the power device 11 and the temperature detection diode 12, and has the device structure 18 for ensuring the insulation of the power line of the power device 11 and the temperature detection diode 12. Thus, by using the semiconductor device 100, it is possible to perform temperature detection even when the high-side transistor is turned ON, without using a high withstand voltage diode in the fore stage of the differential amplifier circuit for the temperature detection.

Embodiment 1

Figure 8:
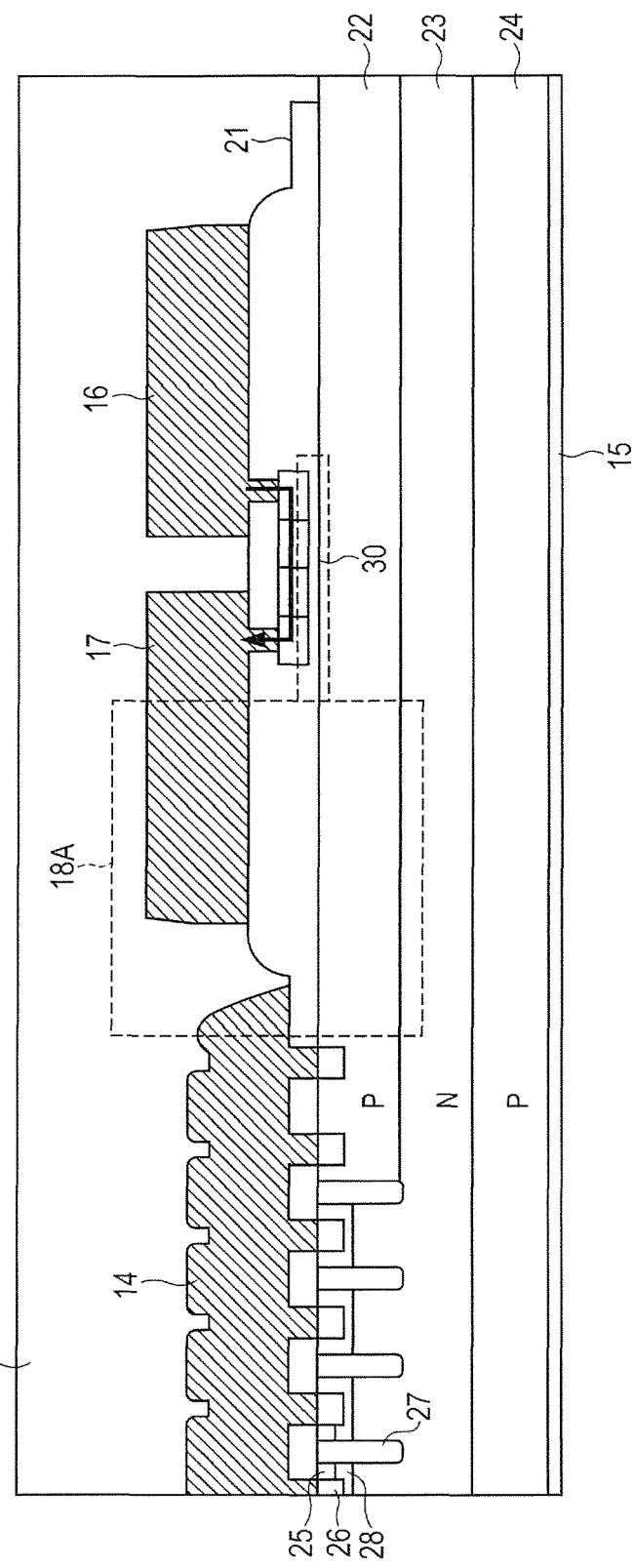
FIG. 8 is a diagram illustrating an example of a cross sectional structure of the semiconductor device according to the embodiment 1.

FIG. 8 is a diagram illustrating an example of a cross sectional structure of a semiconductor device 100A according to the embodiment 1. The semiconductor device 100A according to the embodiment 1 includes a device structure 18A for ensuring insulation of the power line of the power device 11 and the temperature detection diode 12. Any other points are the same as those of the semiconductor device 100 described in the overview of the embodiments, and thus will not be described repeatedly over and over.

The temperature detection diode 12 is formed over an oxide film 30 over the P layer 22 as the emitter region of the power device 11. The device structure 18A is made that the oxide film 30 has a thickness in a manner that the electric field intensity over the oxide film 30 is equal to or lower than 6 MV/cm. The oxide film 30 is a silicon oxide film (SiO2 film).

Figure 9:
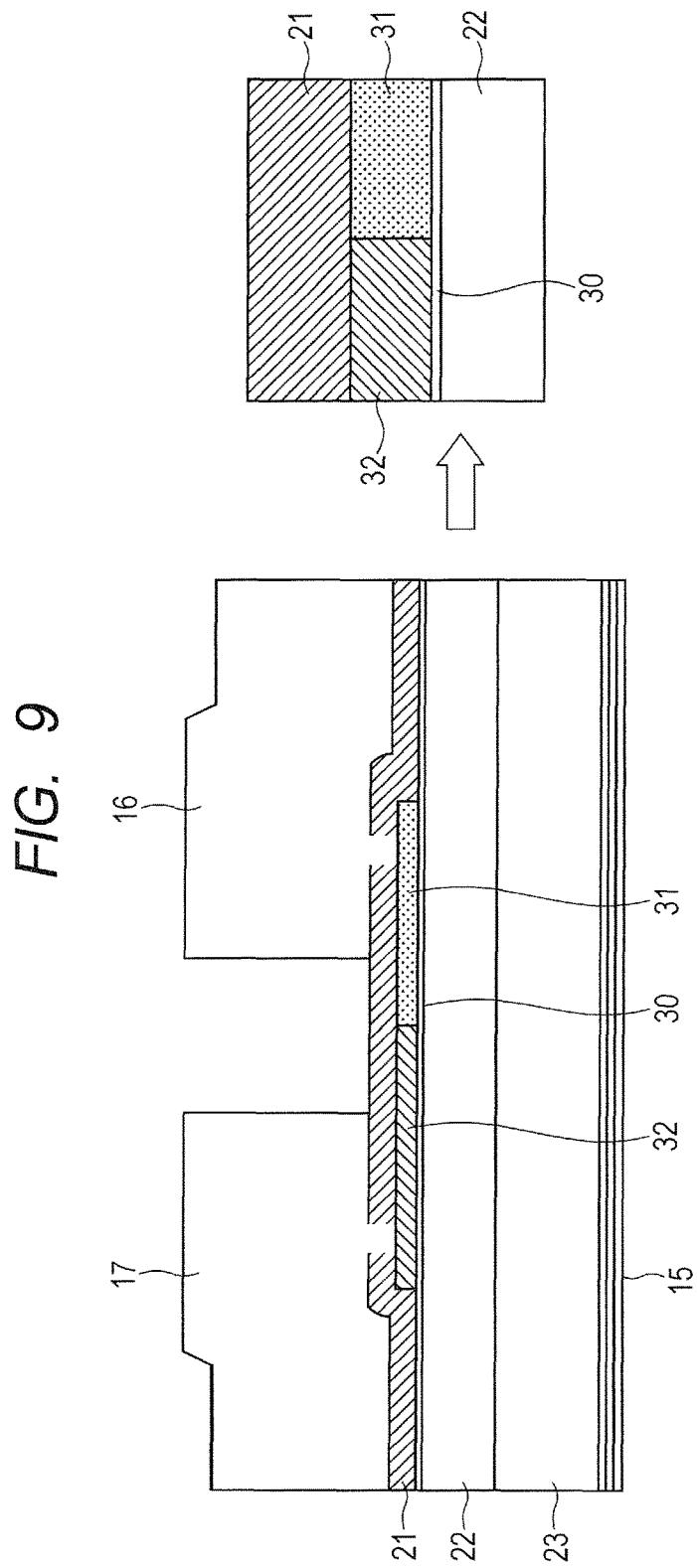
FIG. 9 is a diagram of an enlarged part of a temperature detection diode in FIG. 8.

FIG. 9 is a diagram of an enlarged part of the temperature detection diode in FIG. 8. The temperature detection diode part has the anode electrode 16, the cathode electrode 17, a PolySi (polysilicon) P layer 31 coupled to the anode electrode 16, and a PolySi N layer 32 coupled to the cathode electrode 17. The oxide film 30 is an oxide film between the PolySi P layer 31, the PolySi N layer 32, and the P layer 22 as an emitter region of the power device 11.

Using FIG. 10 and FIG. 11, descriptions will now be made the TDDB (Time Dependent Dielectric Breakdown) calculation, in the case where the oxide film 30 is formed to have a thickness in a manner that the electric field intensity over the oxide film 30 is equal to or lower than 6 MV/cm.

Figure 10:
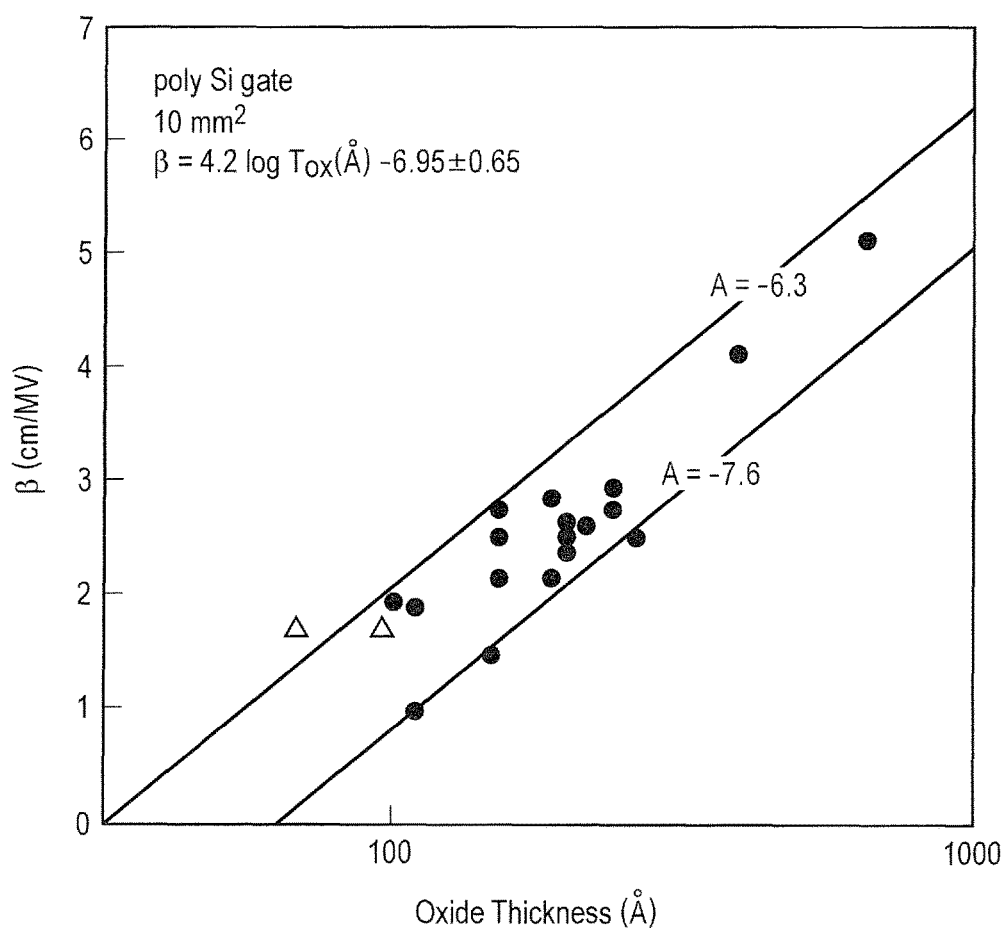
FIG. 10 is a graph showing the relationship between an oxide film thickness and an electric field intensity coefficient $\beta$.

FIG. 10 is a graph showing the relationship between the oxide film thickness and the electric field intensity coefficient β. The graph of FIG. 10 is an extract of an article "Time-Dependent Dielectric Breakdown of Thin Thermally Grown SiO2 Films IEEE TRANSACTIONS ON ELECTRON DEVICES", Vol. ED-32, No. 2, February 1985.

As seen from FIG. 10, the electric field intensity coefficient β can be obtained by 4.2 log $T_{ox}$ (Å)–6.95±0.65. In this case, $T_{ox}$ (Å) represents the thickness of the gate oxide film. Thus, the electric field intensity coefficient β is 9.2, when the thickness of the gate oxide film is 1 μm.

Figure 11:
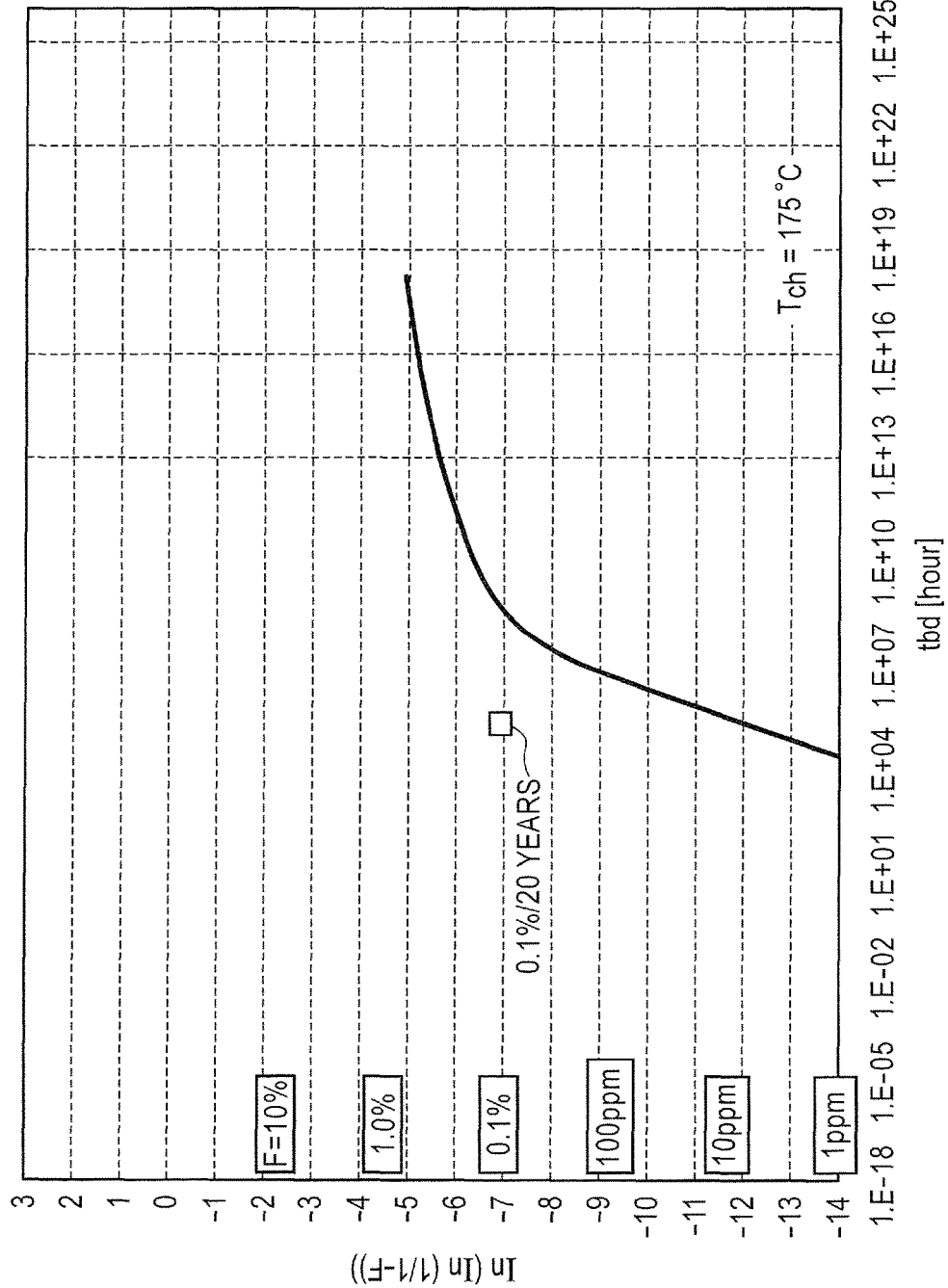
FIG. 11 is a graph showing a result of TDDB trial calculation.

FIG. 11 is a graph showing a result of TDDB trial calculation. The result of the trial calculation of FIG. 11 is a result of a TDDB trial calculation that is performed for the gate oxide film having a thickness 1 µm, using the result of the TDDB test calculation for the gate oxide film having a thickness 73 nm.

The assumption of the trial calculation in FIG. 11 is as follows. β is 9.2 by extrapolation of the above article. The drop ratio and the effective insulation breakdown field effect intensity do not depend on the thickness difference. When Tj=175° C., the electric field intensity 6 MV/cm is continuously applied.

According to the result of the trial calculation of FIG. 11, it can be expected to attain the high quality level with a failure rate lower than 0.1% in twenty years. That is, if the oxide film 30 is to have a thickness in a manner that the electric field intensity over the oxide film 30 is equal to or lower than 6 MV/cm, it can be expected to attain the high quality level. As a result, in the 600 V system device, it can be said that the film thickness of 1 µm or greater is sufficient. Similarly, in the 1200 V system device, it can be said that the film thickness of 2 µm or greater is sufficient.

Figure 12:
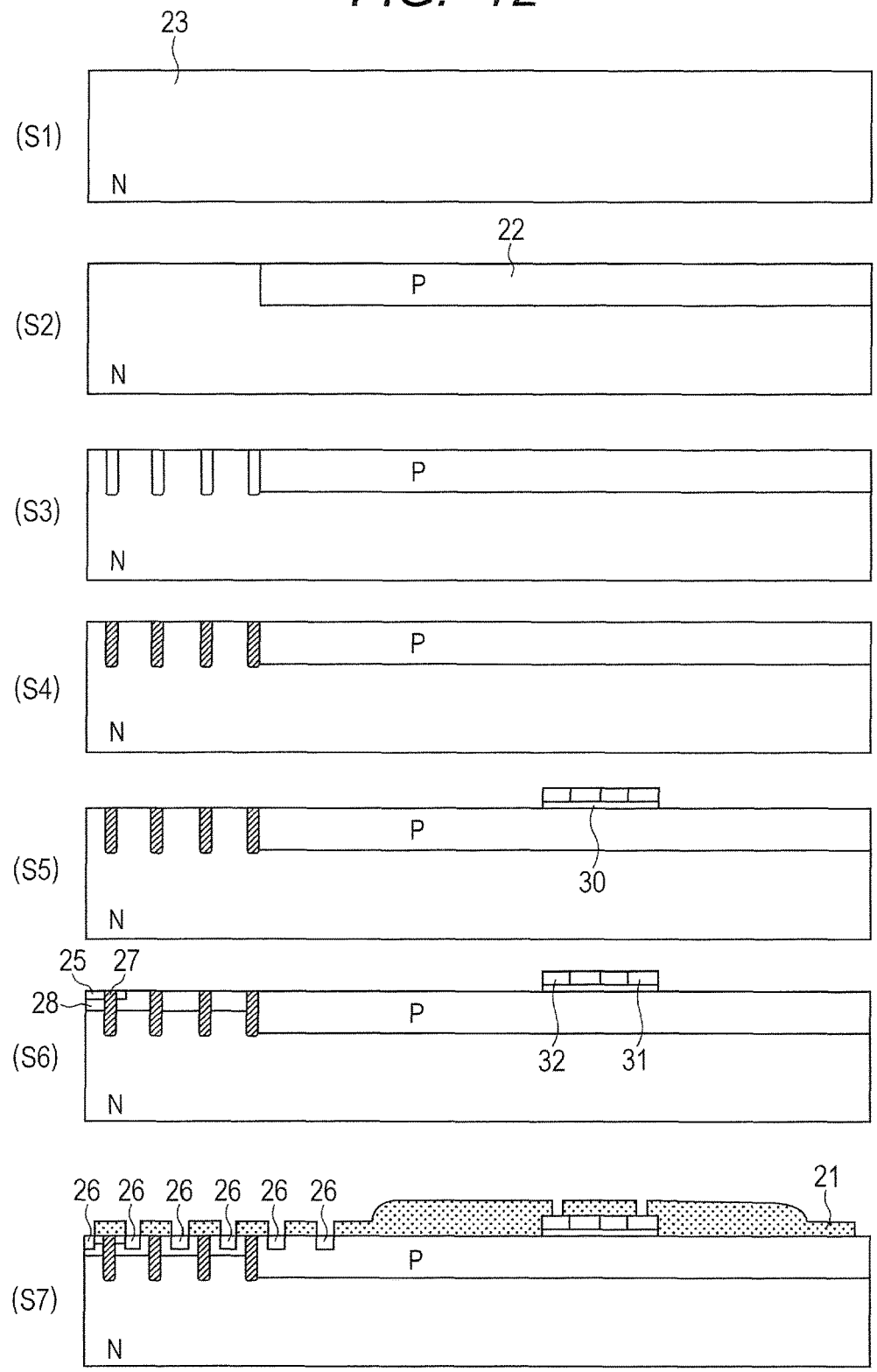
FIG. 12 is a diagram illustrating an example of a process flow of the semiconductor device according to the embodiment 1.

Subsequently, descriptions will now be made to an example of a process flow of the semiconductor device 100A, using FIG. 12 and FIG. 13.

First, deposition and etching of the oxide film are performed (Step S1). P implantation is performed to form a P layer 22 (Step S2). Etching of Si (silicon) is performed (Step S3). Formation of the gate oxide film, deposition of N PolySi, and etching of N PolySi are performed (Step S4). Deposition of the oxide film is performed to form the oxide film 30. Deposition of PolySi, etching of PolySi, and etching of the oxide film are performed (Step S5). In the 600 V system device, deposition of the oxide film is performed in a manner that the film thickness is equal to or greater than 1 µm. In the 1200 V system device, the deposition is performed in a manner that the film thickness is equal to or greater than 2 µm.

P implantation and N implantation for the channel part are performed, to form the N-type region 25, the trench 27, and the P-type region 28. P implantation and N implantation for the temperature detection diode 12 are performed, to form the PolySi P layer 31 and the PolySi N layer 32 (Step S6). In this case, the N implantation can be done simultaneously for the Si part and the temperature detection diode.

Deposition of SOG (Spin On Glass)/PSG (Phospho Silicate Glass) and etching of the oxide film are performed to form the surface insulating film 21. P implantation is performed to form the P-type region 26 (Step S7).

Sputtering of TiW (nitride tungsten) and sputtering of Al (aluminum) are performed, to form the emitter electrode 14, the anode electrode 16, and the cathode electrode 17 (Step S8). Passivation is applied to form the passivation layer 20 (Step S9). Grinding of the back surface, N implantation for the back surface, P implantation, and formation of back metal are performed, to form an N layer 29, the P layer 24, and the collector electrode 15 (Step S10).

As described above, in the semiconductor device 100A according to the embodiment 1, the temperature detection diode 12 is formed over the oxide film 30 over the P layer 22 as the emitter region of the power device 11. The oxide film 30 is formed to have a thickness in a manner that the electric field intensity over the oxide film 30 is equal to or lower than 6 MV/cm. As a result, it is possible to ensure the sufficient insulation withstand voltage between the power line of the power device 11 and the temperature detection diode 12.

In the semiconductor device 100A according to the embodiment 1, the IGBT is used as the power device 11, by way of example. However, as described in the embodiment, the power device 11 is not limited to the IGBT. As the power device 11, the power MOSFET, the diode, or the thyristor may be used.

As described in the overview of the embodiments, the conductive type (p-type or n-type) may be inverted.

That is, in the semiconductor device 100A according to the embodiment 1, it is not limited that the temperature detection diode 12 is formed over the oxide film 30 over the P layer 22 as the emitter region of the power device 11. The power detection diode 12 may be formed over the oxide film in contact with the first conductive type layer included in the power line of the power device 11. Even in this case, the oxide film is formed to have a thickness in a manner that the electric field intensity over the oxide film is equal to or lower than 6 MV/cm. This enables to ensure the sufficient insulation withstand voltage between the power line of the power device 11 and the temperature detection diode 12.

Embodiment 2

Figure 14:
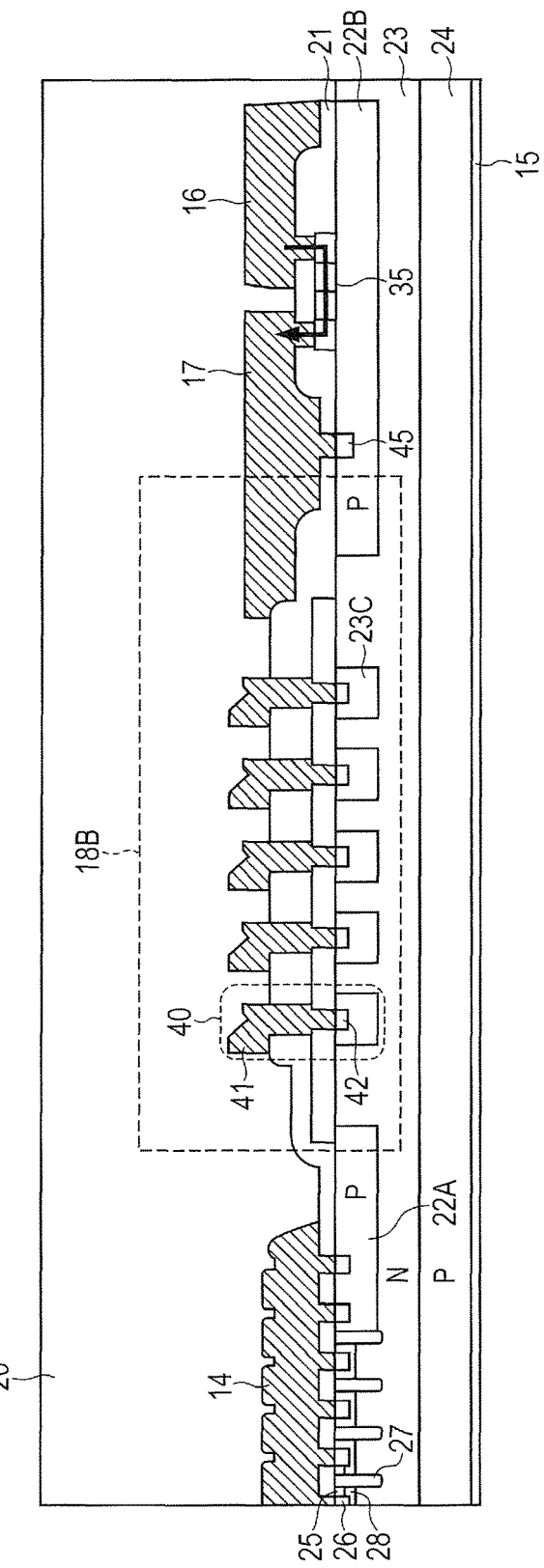
FIG. 14 is a diagram illustrating an example of a cross sectional structure of a semiconductor device according to an embodiment 2.

FIG. 14 is a diagram illustrating an example of a cross sectional structure of a semiconductor device 100B according to the embodiment 2. The semiconductor device 100B according to the embodiment 2 includes a device structure 18B for ensuring insulation between the power line of the power device 11 and the temperature detection diode 12. Any other points are the same as those of the semiconductor device 100 described in the overview of the embodiments, and thus will not be described repeatedly over and over.

In the device structure 18B, a P layer 22A as the emitter region of the power device 11 is separated from a P layer 22B below an oxide film 35 in which the temperature detection diode 12 is formed. The oxide film 35 is not necessarily formed to have a thickness in a manner that the electric field intensity over the oxide film 35 is equal to or lower than 6 MV/cm. In the P layer 22B, a P-type region 45 is formed.

The device structure 18B has a ring structure 40 between the power line of the power device 11 and the temperature detection diode 12. The ring structure 40 includes a metal part 41, a P-type region 42, and a P layer 23C. This is the same structure as the FLR (Field Limiting Ring) which may be used in the peripheral structure of the power device.

The ring structure 40 is to enhance the withstand voltage by evenly applying an electric field to a depletion layer, which is generated from the boundary surface of the P layer 22A and the N layer 23 and extends to the side of the P layer 22B. That is, in the device structure 18B, the sufficient insulation withstand voltage is ensured between the power line of the power device 11 and the temperature detection diode 12, by the ring structure 40.

In the example of FIG. 14, there are five ring structures 40. However, the number of ring structures 40 is not limited to five. The number of ring structures 40 may be decided in accordance with the insulation withstand voltage necessary between the power line of the power device 11 and the temperature detection diode 12. The space between the ring structures 40 may also similarly be decided.

Figure 15:
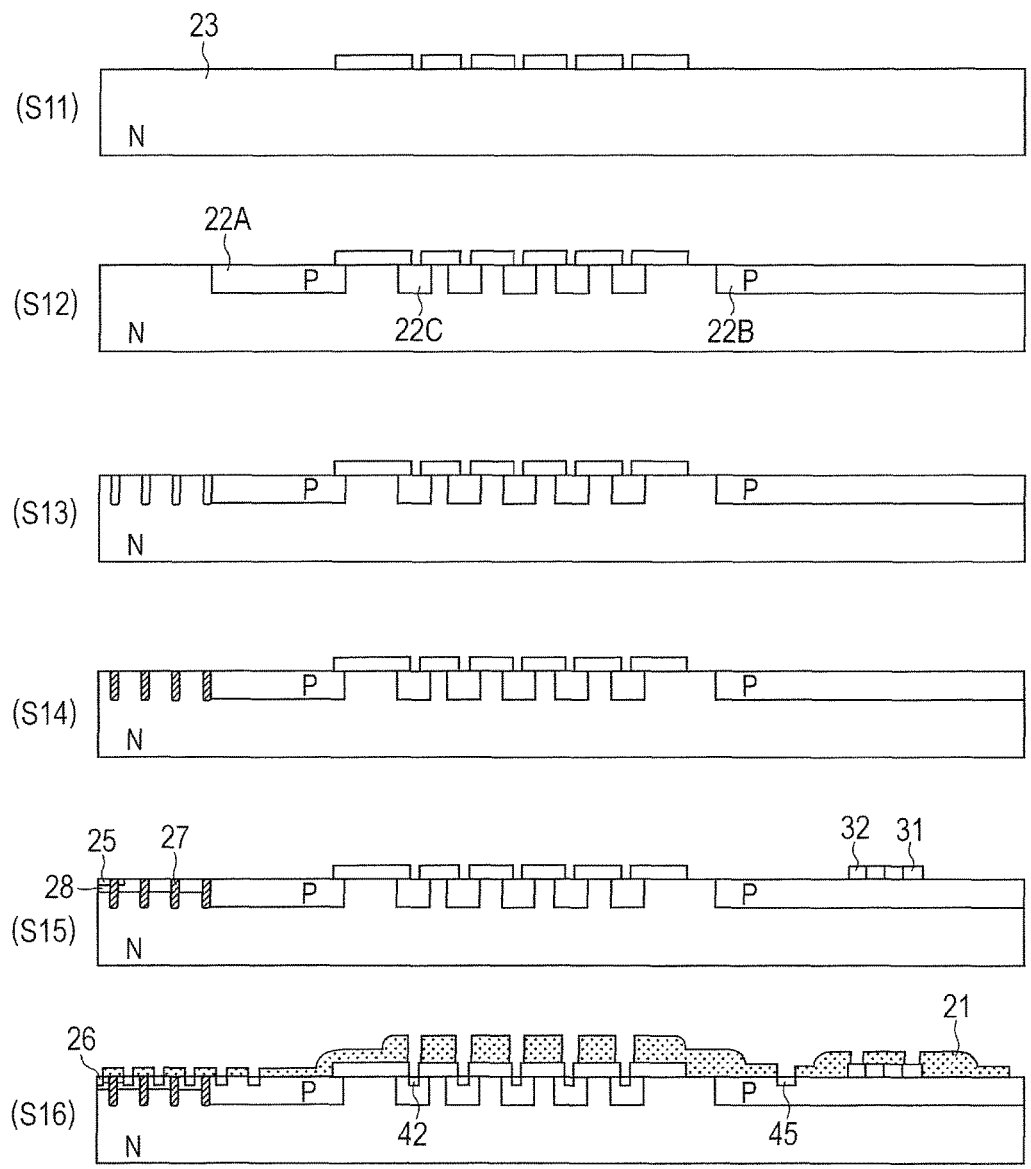
FIG. 15 is a diagram illustrating an example of a process flow of the semiconductor device according to the embodiment 2.
Figure 16:
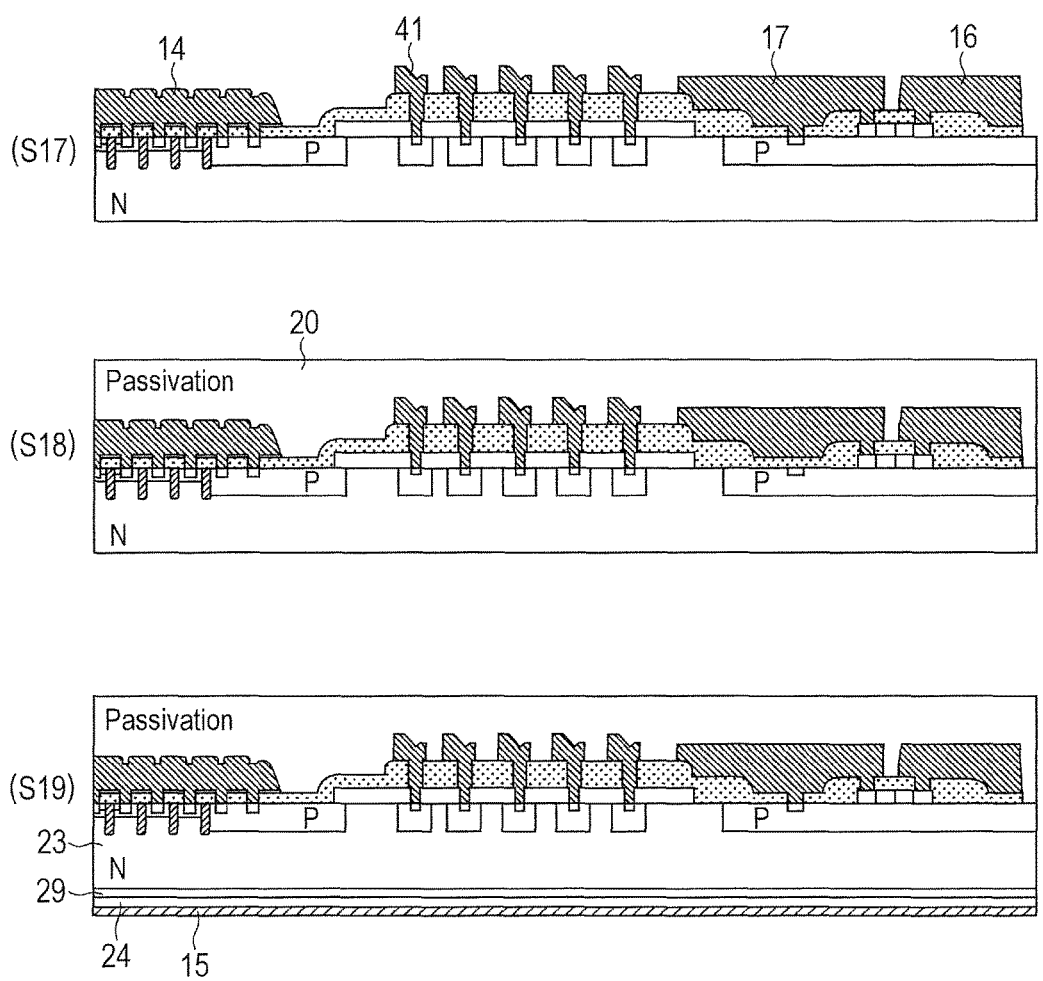
FIG. 16 is a diagram illustrating an example of a process flow of the semiconductor device according to the embodiment 2.

Subsequently, descriptions will now be made to an example of a process flow of the semiconductor device 100B, using FIG. 15 and FIG. 16.

Deposition and etching of the oxide film are performed (Step S11). P implantation is performed, to form the P layer 22A, the P layer 22B, and a P layer 22C (Step S12). Etching of Si is performed (Step S13). Formation of the gate oxide film, deposition of N PolySi, and etching of N PolySi are performed (Step S14).

Deposition of the oxide film, deposition of PolySi, etching of PolySi, and etching of the oxide film are performed. P implantation and N implantation for the channel part are performed, to form the N-type region 25, the trench 27, and the P-type region 28. P implantation and N implantation for the temperature detection diode 12 are performed, to form the PolySi P layer 31, and the PolySi N layer 32 (Step S15). The N implantation can be done simultaneously for the Si part and the temperature detection diode.

Deposition of SOG/PSG and etching of the oxide film are performed to form the surface insulating film 21. P implantation is performed, to form the P-type region 26, the P-type region 42, and the P-type region 45 (Step S16).

Sputtering of TiW and sputtering of Al are performed, to form the emitter electrode 14, the anode electrode 16, the cathode electrode 17, and the metal part 41 (Step S17). Passivation is applied to form the passivation layer 20 (Step S18). Grinding of the back surface, N implantation for the back surface, P implantation, and formation of back metal are performed, to form the N layer 29, the P layer 24, and the collector electrode 15 (Step S19).

As described above, the semiconductor device 100B according to the embodiment 2 has the ring structure 40 between the power line of the power device 11 and the temperature detection diode 12. This enables to ensure the sufficient insulation withstand voltage between the power line of the power device 11 and the temperature detection diode 12. The semiconductor device 100B has the ring structure 40. Though there is a remarkable loss in the active area, it is possible to make the configuration using the same process as the conventional process. Thus, an advantage is that there is no increase in the process cost.

Modification of Embodiment 2

Figure 17:
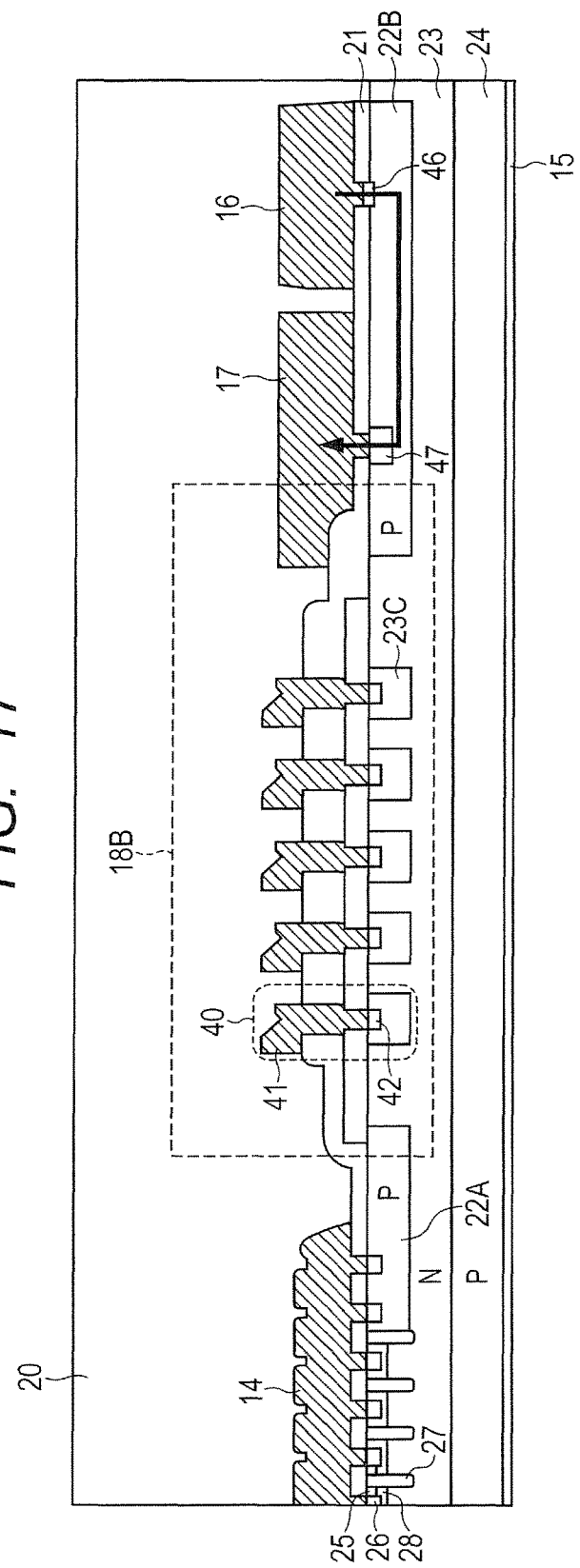
FIG. 17 is a diagram illustrating an example of a cross sectional structure of the semiconductor device according to a modification of the embodiment 2.

The descriptions have been made to the example in which the temperature detection diode 12 is formed over the oxide film 35, in the semiconductor device 100B of FIG. 14. However, it is not limited to this example. It is possible to attain the same effect, even if the temperature detection diode is formed inside the P layer 22B, that is, inside the silicon, like a semiconductor device 100C of FIG. 17. In the example of FIG. 17, a P-type region 46 and an N-type region 47 are formed in the P layer 22B.

Figure 18:
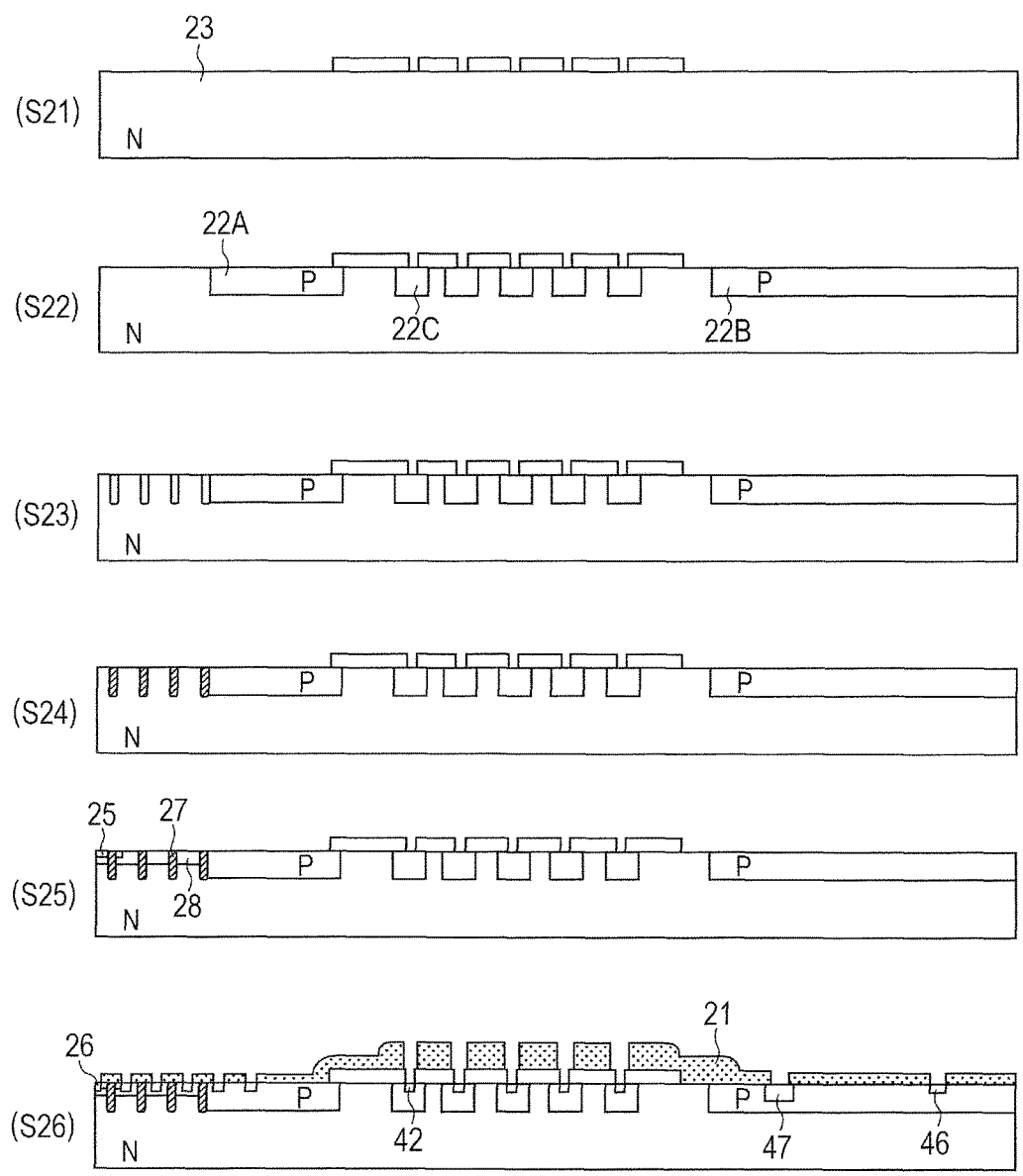
FIG. 18 is a diagram illustrating an example of a process flow of the semiconductor device according to a modification of the embodiment 2.
Figure 19:
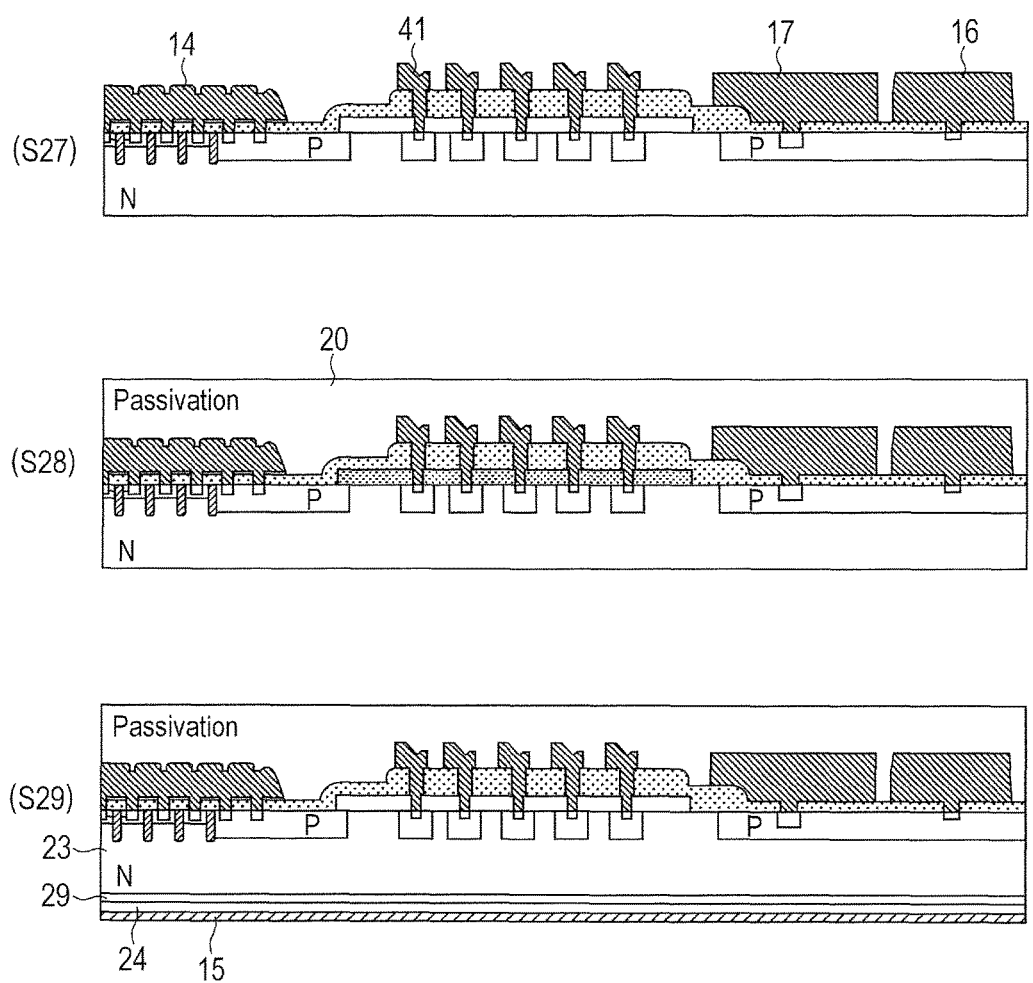
FIG. 19 is a diagram illustrating an example of a process flow of the semiconductor device according to a modification of the embodiment 2.

Descriptions will now be made to an example of a process flow of the semiconductor device 100C, using FIG. 18 and FIG. 19.

Deposition and etching of the oxide film are performed (Step S21). P implantation is performed, to form the P layer 22A, the P layer 22B, and the P layer 22C (Step S22). Etching of Si is performed (Step S23). Formation of the gate oxide film, deposition of N PolySi, and etching of N PolySi are performed (Step S24).

P implantation and N implantation for the channel part are performed, to form the N-type region 25, the trench 27, and the P-type region 28 (Step S25).

Deposition of SOG/PSG and etching of the oxide film are performed to form the surface insulating film 21. P implantation and N implantation are performed to form the P-type region 26, the P-type region 42, the P-type region 46, and the N-type region 47 (Step S26).

Sputtering of TiW and sputtering of Al are performed, to form the emitter electrode 14, the anode electrode 16, the cathode electrode 17, and the metal part 41 (Step S27). Passivation is applied to form the passivation layer 20 (Step S28). Grinding of the back surface, N implantation for the back surface, P implantation, and formation of the back metal are performed, to form the N layer 29, the P layer 24, and the collector electrode 15 (Step S29).

As described above, like the semiconductor device 100B according to the embodiment 2, the semiconductor device 100C according to the modification of the embodiment 2 has the ring structure 40 between the power line of the power device 11 and the temperature detection diode 12. With this configuration, it is possible to ensure the sufficient insulation withstand voltage between the power line of the power device 11 and the temperature detection diode 12.

Embodiment 3

Figure 20:
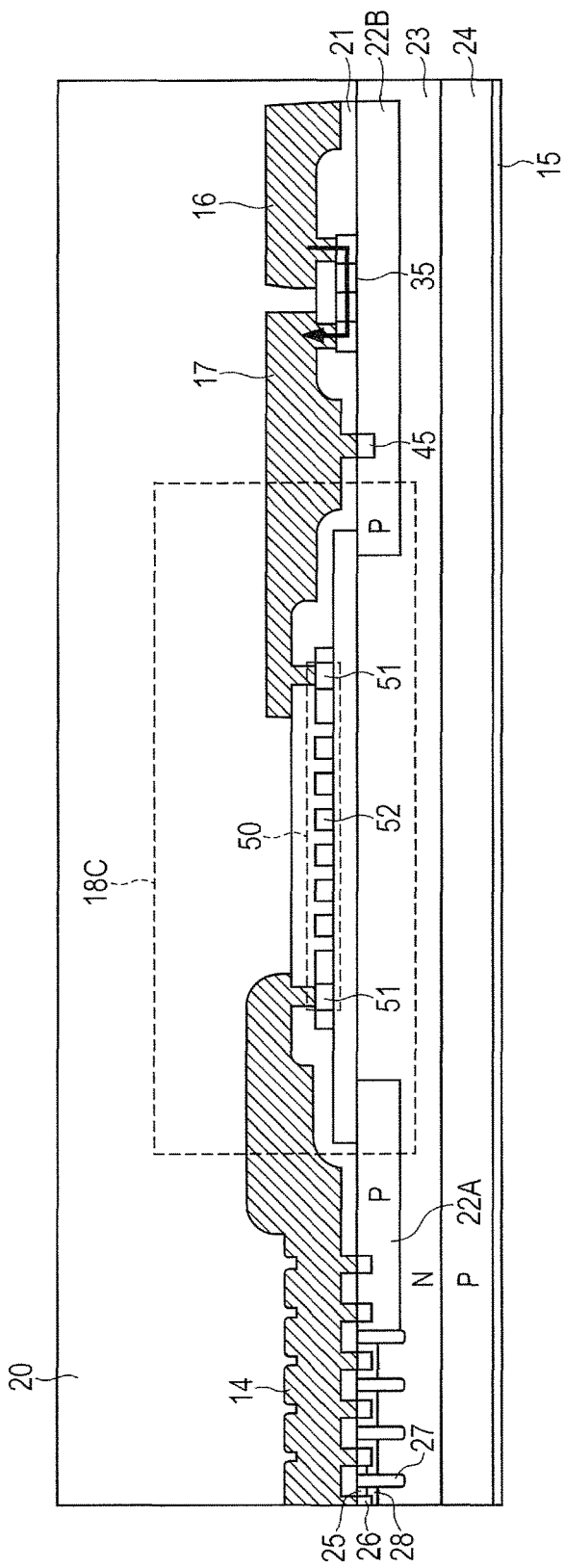
FIG. 20 is a diagram illustrating an example of a cross sectional structure of a semiconductor device according to an embodiment 3.

FIG. 20 is a diagram illustrating an example of a cross sectional structure of a semiconductor device 100D according to an embodiment 3. The semiconductor device 100D according to the embodiment 3 includes a device structure 18C for ensuring the insulation between the power line of the power device 11 and the temperature detection diode 12. Any other points are the same as those of the semiconductor device 100 described in the overview of the embodiments, and thus will not be described repeatedly over and over.

In the device structure 18C, the P layer 22A as the emitter region of the power device 11 is separated from the P layer 22B below the oxide film 35 where the temperature detection diode 12 is formed. The oxide film 35 is not necessarily formed to have a thickness in a manner that the electric field intensity over the oxide film 35 is equal to or lower than 6 MV/cm. The P-type region 45 is formed in the P layer 22B.

The device structure 18C has a resistor 50 between the emitter electrode 14 of the power device 11 and the cathode electrode 17 of the temperature detection diode 12. That is, it has the resistor 50 between the first conductive type electrode included in the power line of the power device 11 and the cathode electrode 17 of the temperature detection diode 12. The resistor 50 includes a P-type region 51 and a polysilicon part 52.

In the device structure 18C, by the resistor 50, a voltage of the first conductive type electrode included in the power line of the power device 11 is not to be applied to the cathode electrode 17 of the temperature detection diode 12. Specifically, the resistance value of the resistor 50 is made to be a value that the leakage current is equal to or lower than 10 μA. That is, the resistance value of the resistor 50 is 60 MΩ in the 600 V system device, and the value is 120 MΩ in the 1200 V system device. Thus, in the device structure 18C, by the resistor 50, the sufficient insulation withstand voltage is ensured between the power line of the power device 11 and the temperature detection diode 12.

Figure 21:
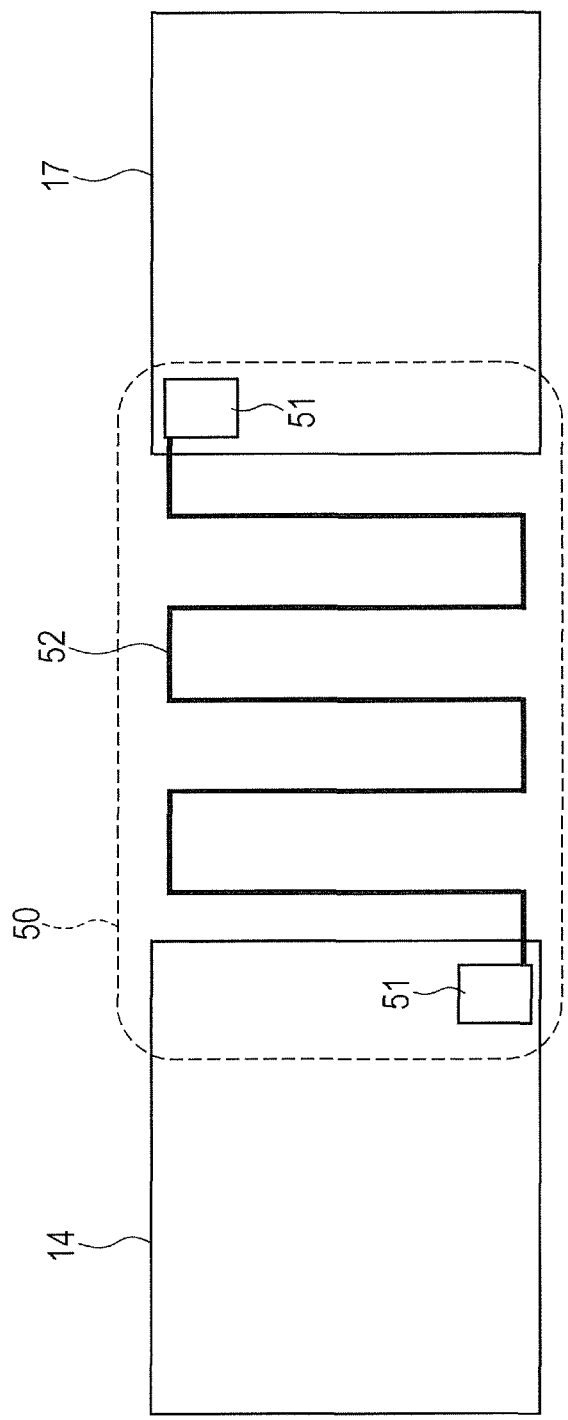
FIG. 21 is a plan image diagram illustrating an emitter electrode, a cathode electrode, and a resistor of FIG. 20.

FIG. 21 is a plan image diagram illustrating the emitter electrode 14, the cathode electrode 17, and the resistor 50 of FIG. 20. The emitter electrode 14 is coupled to the cathode electrode 17 through the polysilicon part 52 and the P-type region 51.

Figure 22:
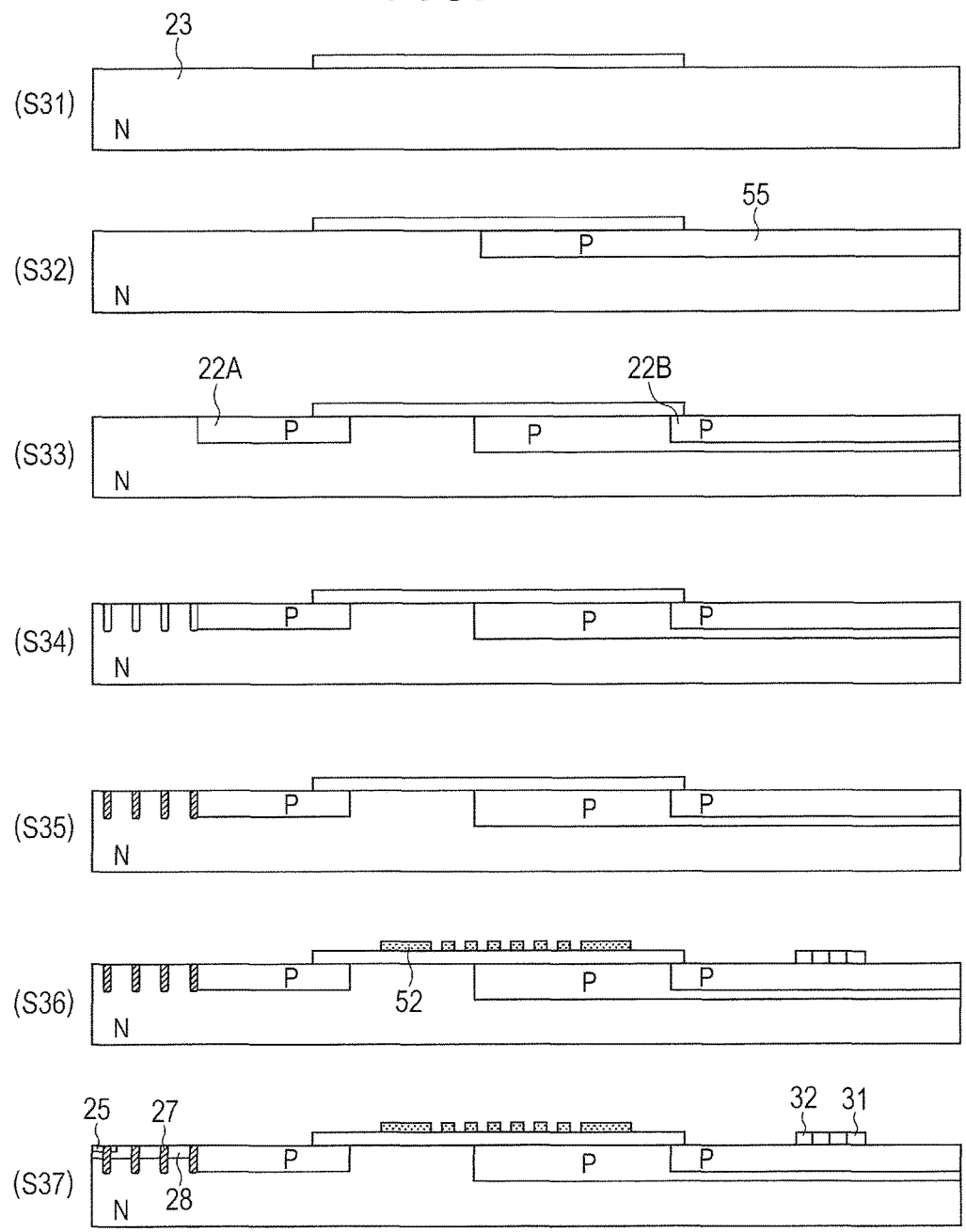
FIG. 22 is a diagram illustrating an example of a process flow of the semiconductor device according to the embodiment 3.

Subsequently, using FIG. 22 and FIG. 23, descriptions will now be made to an example of a process flow of the semiconductor device 100D.

Deposition and etching of the oxide film are performed (Step S31). P implantation is performed to form a P layer 55 (Step S32). The P implantation is preferably performed for the sake of improving the withstand voltage, but may not be performed in accordance with the necessary specification. In the example of FIG. 20, the P layer 55 is not formed.

P implantation is performed, to form the P layer 22A and the P layer 22B (Step S33). Etching of Si is performed (Step S34). Formation of the gate oxide film, deposition of N PolySi, and etching of N PolySi are performed (Step S35).

Deposition of the oxide film, deposition of PolySi, etching of PolySi, and etching of the oxide film are performed (Step S36). By Step S36, the polysilicon part 52 is performed.

P implantation and N implantation for the channel part are performed, to form the N-type region 25, the trench 27, and the P-type region 28. P implantation and N implantation for the temperature detection diode 12 are performed, to form the PolySi P layer 31 and the PolySi N layer 32 (Step S37). In this case, the N implantation can be done simultaneously for the Si part and the temperature detection diode.

Deposition of SOG/PSG and etching of the oxide film are performed to form the surface insulating film 21. P implantation is performed, to form the P-type region 26, the P-type region 45, and the P-type region 51 (Step S38).

Sputtering of TiW and sputtering of Al are performed, to form the emitter electrode 14, the anode electrode 16, and the cathode electrode 17 (Step S39). Passivation is applied to form the passivation layer 20 (Step S40). Grinding of the back surface, N implantation for the back surface, and P implantation, and formation of back metal are performed, to form the N layer 29, the P layer 24, and the collector electrode 15 (Step S41).

As described above, the semiconductor device 100D according to the embodiment 3 is to have the resistor 50 between the first conductive type electrode included in the power line of the power device 11 and the cathode electrode 17 of the temperature detection diode 12. By the resistor 50, it is possible to ensure the sufficient insulation withstand voltage between the power line of the power device 11 and the temperature detection diode 12. Because the semiconductor device 100D has the resistor 50, there is a remarkable loss in the active area, and an advantage is that there is no increase in the process cost due to the configuration enabled using the same process as the conventional process. The loss in the active area in the semiconductor device 100D can be smaller than the loss in the semiconductor device 100B of the embodiment 2.

Modification of Embodiment 3

Figure 24:
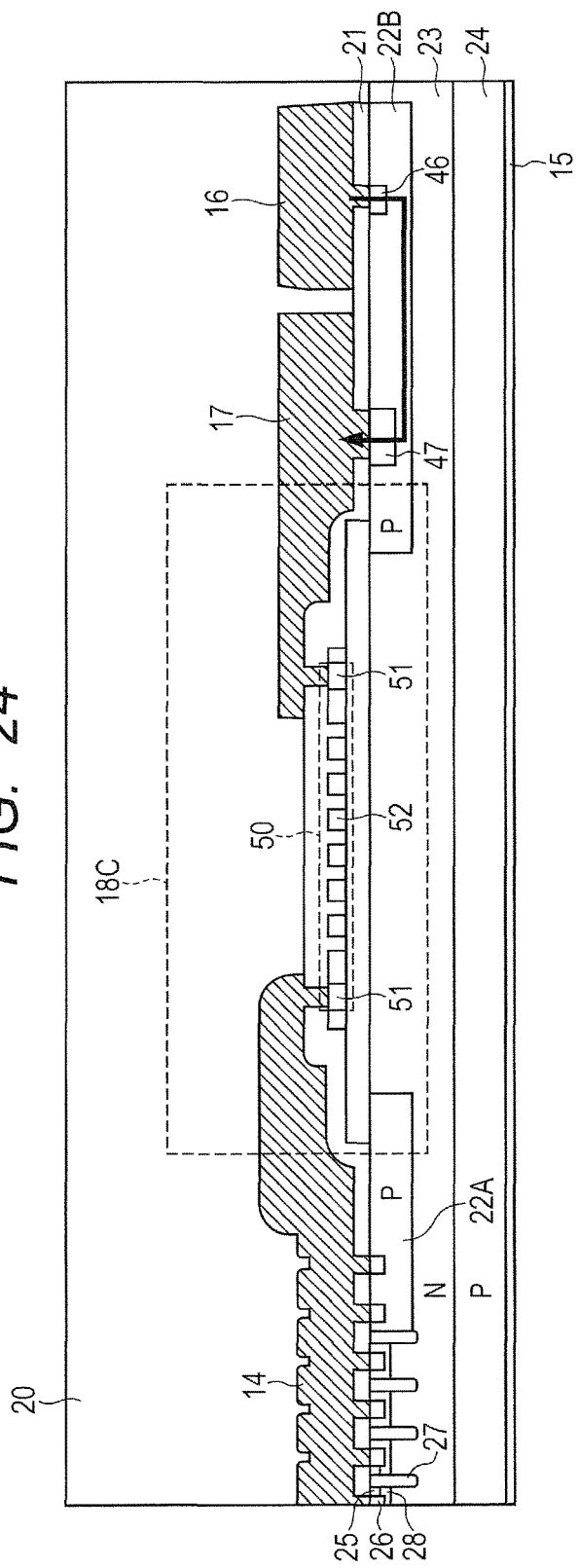
FIG. 24 is a diagram illustrating an example of a cross sectional structure of the semiconductor device according to a modification of the embodiment 3.

The descriptions have been made to the example in which the temperature detection diode 12 is formed over the oxide film 35, in the semiconductor device 100D of FIG. 20. However, it is not limited to this example. It is possible to attain the same effect, even if the temperature detection diode is formed inside the P layer 22B, that is, inside the silicon, like a semiconductor device 100E of FIG. 24. In the example of FIG. 24, a P-type region 46 and an N-type region 47 are formed in the P layer 22B.

Figure 25:
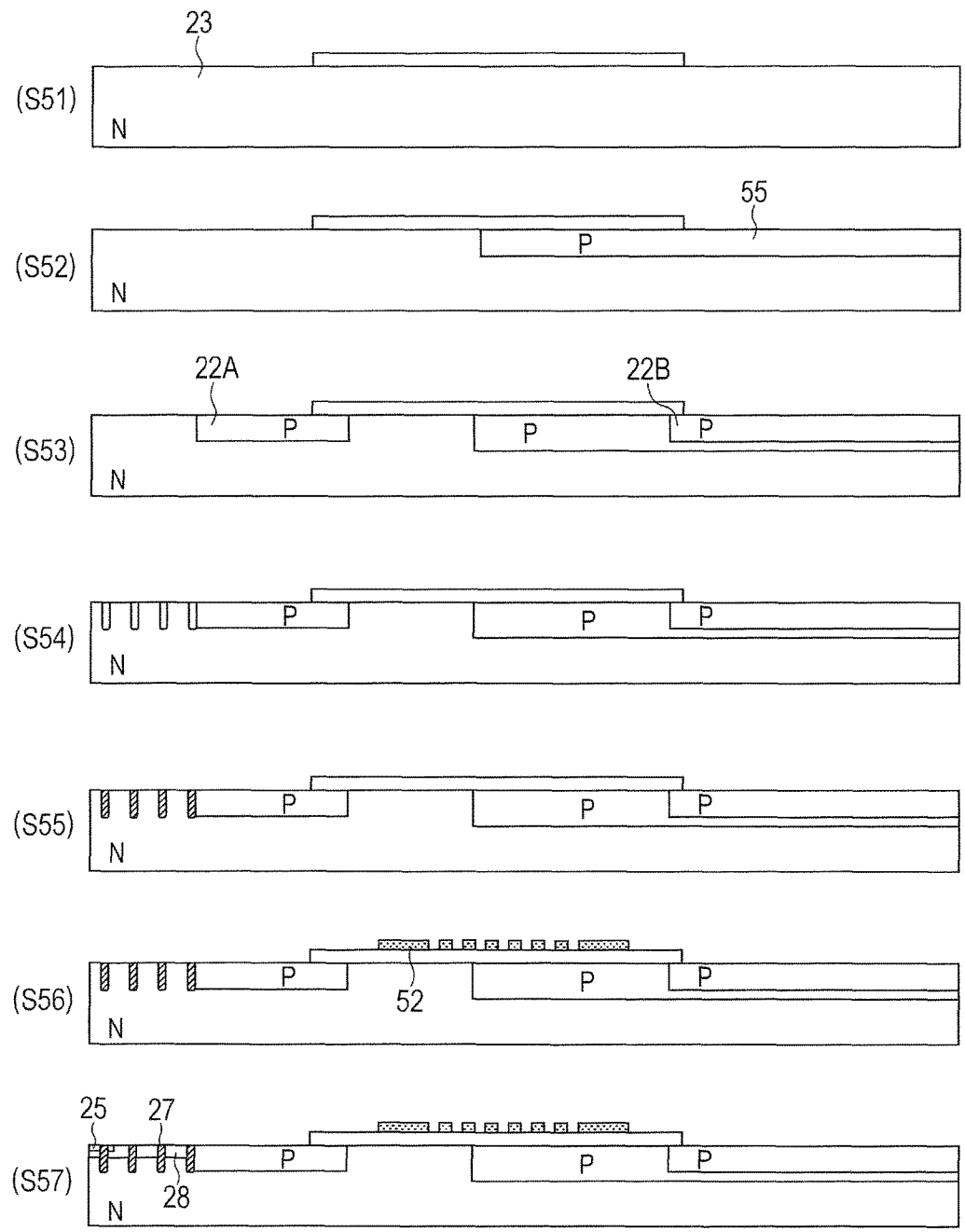
FIG. 25 is a diagram illustrating an example of a process flow of the semiconductor device according to a modification of the embodiment 3.
Figure 26:
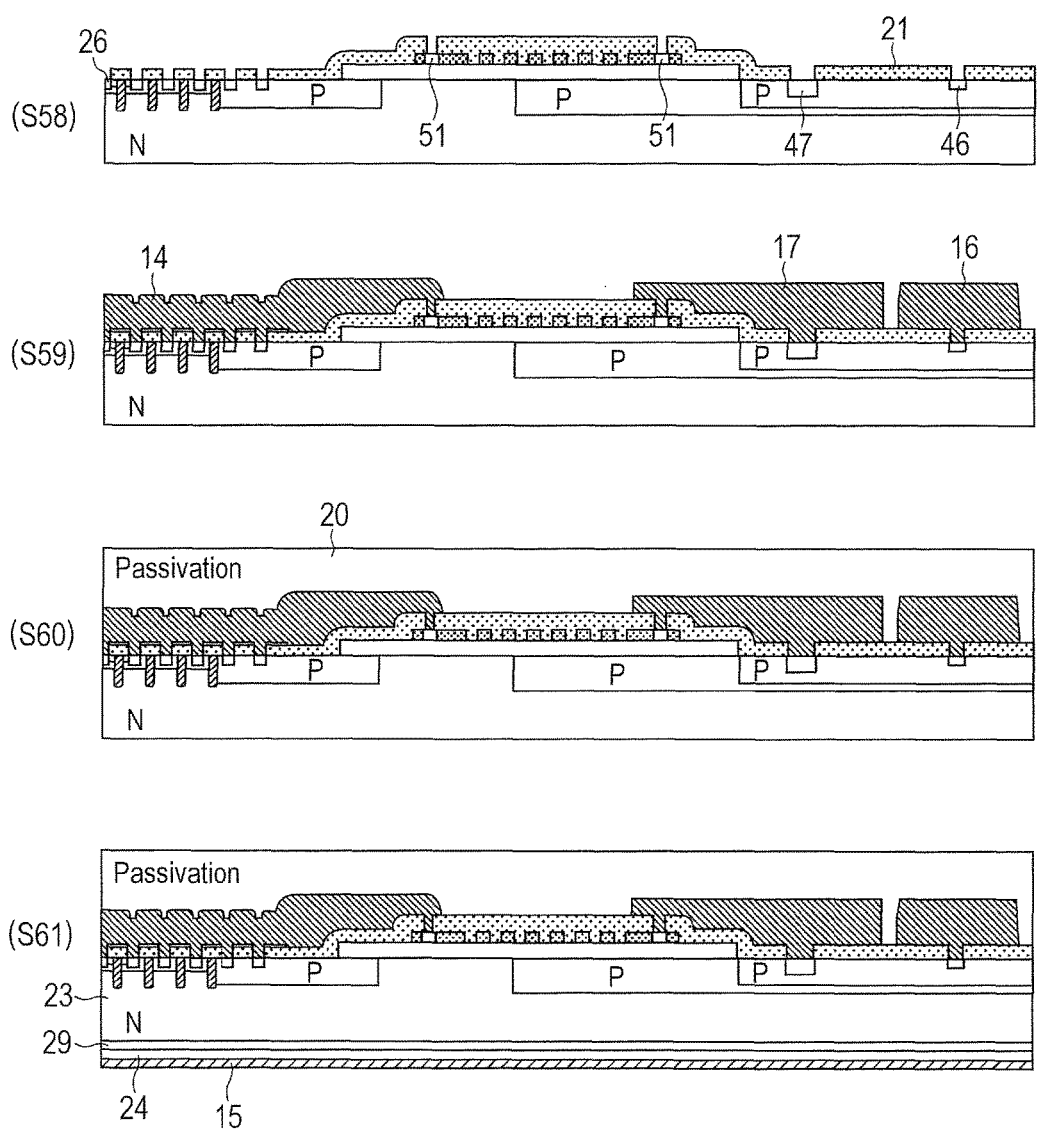
FIG. 26 is a diagram illustrating an example of a process flow of the semiconductor device according to a modification of the embodiment 3.

Descriptions will now be made to an example of a process flow of the semiconductor device 100E, using FIG. 25 and FIG. 26.

Deposition and etching of the oxide film are performed (Step S51). P implantation is performed to form a P layer 55 (Step S52). P implantation is preferably formed for the sake of improving the withstand voltage, but may not be formed in accordance with the necessary specification. In the example of FIG. 24, the P layer 55 is not formed.

P implantation is performed to form the P layer 22A and the P layer 22B (Step S53). Etching of Si is performed (Step S54). Then, formation of the gate oxide film, deposition of N PolySi, and etching of Si are performed (Step S55).

Deposition of the oxide film and deposition of PolySi are performed (Step S56). By Step S56, the polysilicon part 52 is formed.

P implantation and N implantation for the channel part are performed, to form the N-type region 25, the trench 27, and the P-type region 28 (Step S57).

Deposition of SOG/PSG and etching of the oxide film are performed to form the surface insulating film 21. P implantation and N implantation are performed, to form the P-type region 26, the P-type region 46, the N-type region 47, and the P-type region 51 (Step S58).

Sputtering of TiW and sputtering of Ti are performed, to form the emitter electrode 14, the anode electrode 16, and the cathode electrode 17 (Step S59). Passivation is applied to form the passivation layer 20 (Step S60). Grinding of the back surface, N implantation for the back surface, P implantation, and formation of back metal are performed, to form the N layer 29, the P layer 24, and the collector electrode 15 (Step S61).

As described above, the semiconductor device 100E according to the modification of the embodiment 3 has the resistor 50 between the first conductive type electrode included in the power line of the power device 11 and the cathode electrode 17 of the temperature detection diode 12, like the semiconductor device 100D according to the embodiment 3. By the resistor 50, it is possible to ensure the sufficient insulation withstand voltage between the power line of the power device 11 and the temperature detection diode 12.

Accordingly, the descriptions have specifically been made the inventions made by the present inventors, based on the preferred embodiments. However, the present invention is not limited to the above-described embodiments. Various changes may possibly be made without departing from the scope thereof.

What is claimed is:

1. A semiconductor device comprising:
   a power device; and
   a temperature detection diode,
   wherein the semiconductor device has a device structure configured to insulate between a power line of the power device and the temperature detection diode, and
   wherein the device structure comprises a resistor between a first conductive type electrode included in the power line of the power device and a cathode electrode of the temperature detection diode.

2. The semiconductor device according to claim 1, wherein the resistor has a resistance value that a leakage current is equal to or lower than 10 μA.

3. The semiconductor device according to claim 1, wherein the resistor is formed of polysilicon.

4. The semiconductor device according to claim 1, wherein the temperature detection diode is formed over an oxide film in contact with a first conductive type layer included in the power line of the power device.

5. The semiconductor device according to claim 1, wherein the temperature detection diode is formed inside silicon.

6. The semiconductor device according to claim 1, wherein the power device is a IGBT (Insulated Gate Bipolar Transistor), a power MOSFET (Metal-Oxide-Semiconductor Field Effect Transistor), a diode, or a thyristor.

* * * * *